(12) United States Patent
Otaka et al.

(10) Patent No.: US 7,590,400 B2
(45) Date of Patent: Sep. 15, 2009

(54) RADIO APPARATUS

(75) Inventors: Shoji Otaka, Yokohama (JP); Hiroshi Tsurumi, Kawasaki (JP); Hiroshi Yoshida, Yokohama (JP); Syuichi Sekine, Yokohama (JP); Hiroyuki Kayano, Yokohama (JP); Tadahiko Maeda, Menlo Park, CA (US)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 478 days.

(21) Appl. No.: 11/621,148

(22) Filed: Jan. 9, 2007

(65) Prior Publication Data

US 2007/0111673 A1 May 17, 2007

Related U.S. Application Data

(62) Division of application No. 10/957,624, filed on Oct. 5, 2004, now Pat. No. 7,184,738, which is a division of application No. 09/990,301, filed on Nov. 23, 2001, now Pat. No. 6,816,712, which is a division of application No. 09/039,464, filed on Mar. 16, 1998, now Pat. No. 6,339,711.

(30) Foreign Application Priority Data

Mar. 14, 1997 (JP) .................................. P9-060879

(51) Int. Cl.
*H04B 1/10* (2006.01)
(52) U.S. Cl. ........................................ 455/312; 455/324
(58) Field of Classification Search .................. 455/296, 455/302–303, 306, 307, 312, 314, 317, 323, 455/324, 285; 375/346
See application file for complete search history.

(56) References Cited

U.S. PATENT DOCUMENTS 4,243,941 A 1/1981 Zdunek (Continued)

FOREIGN PATENT DOCUMENTS

DE 27 10 752 9/1978

(Continued)

OTHER PUBLICATIONS

Patent Abstracts of Japan, JP 08-154063, Jun. 11, 1996.

*Primary Examiner*—Tony T Nguyen
(74) *Attorney, Agent, or Firm*—Oblon, Spivak, McClelland, Maier & Neustadt, P.C.

(57) ABSTRACT

In a radio apparatus, the band of a loop filter of a synthesizer in a blank channel searching state is narrower than the band in a communicating state. In addition, a radio wave environment is measured. A characteristic necessary for the radio apparatus is determined corresponding to the measured-radio wave environment. The power is controlled corresponding to the performance of the radio apparatus. Thus, the power consumption is decreased. In addition, the efficiency of the output power is improved. In the radio apparatus, the current consumption of a power amplifier PA is measured. A matching circuit (LNA or MIX) of the antenna is adjusted with the measured result so as to decrease an antenna loss. In the radio apparatus, a DC offset is removed from the transmitted power and the reflected wave. When the DC offset is removed using an AC coupling capacitor, the deterioration of the frequency characteristic of the receiving portion is compensated with a capacitor in a digital signal process. In the radio apparatus, a transmission power detecting portion is structured as an IC chip. The transmission power detecting portion detects the transmission power corresponding to leakage currents in the power supply of the IC chip and the ground. Thus, when the power is detected, a power loss is suppressed. Consequently, the power consumption of the radio apparatus can be decreased.

2 Claims, 22 Drawing Sheets

U.S. PATENT DOCUMENTS

| | | | |
|---|---|---|---|
| 4,903,319 A | 2/1990 | Kasai et al. |
| 5,175,729 A | 12/1992 | Borras et al. |
| 5,179,724 A | 1/1993 | Lindoff |
| 5,241,702 A | 8/1993 | Dent |
| 5,339,040 A | 8/1994 | Loper |
| 5,412,341 A | 5/1995 | Walczak |
| 5,422,889 A | 6/1995 | Sevenhans et al. |
| 5,442,322 A | 8/1995 | Kornfeld et al. |
| 5,448,756 A | 9/1995 | DeLuca et al. |
| 5,448,763 A | 9/1995 | Gillig |
| 5,471,655 A | 11/1995 | Kivari |
| 5,497,125 A | 3/1996 | Royds |
| 5,519,887 A | 5/1996 | Lieu |
| 5,724,653 A | 3/1998 | Baker et al. |
| 5,818,544 A | 10/1998 | Han |
| 5,838,735 A | 11/1998 | Khullar |
| 5,852,772 A | 12/1998 | Lampe et al. |
| 5,862,139 A | 1/1999 | Yanagi |
| 5,898,912 A | 4/1999 | Heck et al. |
| 5,953,643 A | 9/1999 | Speake et al. |
| 5,999,802 A | 12/1999 | Aschwanden |
| 6,339,711 B1 | 1/2002 | Otaka et al. |
| 6,507,627 B1 | 1/2003 | Imura |
| 6,816,712 B2 | 11/2004 | Otaka et al. |

FOREIGN PATENT DOCUMENTS

| | | |
|---|---|---|
| EP | 0 594 894 | 5/1994 |
| GB | 2 301 964 | 12/1996 |
| JP | 57-60739 | 4/1982 |
| JP | 58-68323 | 4/1983 |
| JP | 61-25338 | 2/1986 |
| JP | 62-157426 | 7/1987 |
| JP | 63-253730 | 10/1988 |
| JP | 5-55935 | 3/1993 |
| JP | 5-110464 | 4/1993 |
| JP | 5-175873 | 7/1993 |
| JP | 05-068134 | 9/1993 |
| JP | 07-162303 | 6/1995 |
| JP | 07-327002 | 12/1995 |
| JP | 8-8775 | 1/1996 |
| JP | 8-163086 | 6/1996 |
| JP | 8-242132 | 9/1996 |
| JP | 8-307465 | 11/1996 |
| WO | WO 95/30275 | 11/2005 |

RADIO APPARATUS

CROSS-REFERENCE TO RELATED APPLICATION

This application is a Divisional Application of application Ser. No. 10/957,624, which is a Divisional Application of application Ser. No. 09/990,301 now U.S. Pat. No. 6,816,712, which is a Divisional Application of application Ser. No. 09/039,464 now U.S. Pat. No. 6,339,711. This application is based upon and claims the benefit of priority under 35 USC § 119 from prior Japanese patent Application No. 9-060879, filed on Mar. 14, 1997, the entire contents of which are incorporated herein by reference.

BACKGROUND OF THE INVENTION

1. Field of the Invention

The present invention relates to a radio apparatus such as a portable radiotelephone apparatus.

2. Description of the Related Art

In recent years, an increasing number of portable radiotelephone apparatuses (hereinafter referred to as portable telephone apparatuses) have been used. In addition, portable telephone apparatuses that are small and that have high performance have been aggressively developed.

Current developing trends of portable telephone apparatus are for example small size for high portability, low power consumption for long time operation, and high linearity for high resistance against disturbing waves.

Currently, studies for solving problems necessary to accomplish such features have been performed.

Next, problems of the current portable telephone apparatus will be described in the order of a receiving portion, a synthesizer (namely, a local oscillator), a transmitting portion, and an antenna.

First, problems of the receiving portion will be described.

The receiving portion has two problems. As a first problem, the current consumption of the portable telephone apparatus is large. As a second problem, when a signal is received, a DC offset takes place, resulting in causing the reception characteristic of the portable telephone apparatus to deteriorate.

Since the reception characteristic of the portable telephone apparatus should always satisfy the required performance, the reception characteristic is designated so that the portable telephone apparatus properly operates in the worst radio wave environment. An example of the worst radio wave environment is a situation of which an unnecessary signal defined as a mutual modulation characteristic or a selectivity of adjacent channels is present. In other words, when an unnecessary signal other than a necessary signal is present in a system band, the level of the unnecessary signal is the maximum value of which a desired bit error rate defined in the system is satisfied.

Generally, to satisfy the standard value of the system in the worst radio wave environment, the radio apparatus should properly operate in the worst condition. Thus, in other than the worst radio wave environment, the portable telephone apparatus operate with the performance that satisfies the worst condition. To satisfy the standard in case of the worst radio wave environment, the receiving portion of the portable telephone apparatus should have linearity. In other words, the distortion of the receiving portion should be decreased so that the standard is satisfied. This problem relates to currents that flow in circuit blocks of the receiving portion (such as a low noise amplifier and a frequency converter).

Generally, to improve the linearity of a circuit, the operating current thereof should be increased. Thus, the power consumption of the portable telephone apparatus considered for the worst radio wave environment excessively increases. This is because the portable telephone apparatus is not always in the worst radio wave environment. In other words, the portable telephone apparatus normally operates in other than the worst radio wave environment.

Next, the second problem of the receiving portion (namely, when a signal is received, a DC offset causes the reception characteristic to deteriorate.

Generally, in an active circuit such as a frequency converter, a low frequency filter, or a low frequency amplifier used in the receiving portion of the portable telephone apparatus, the output signal thereof overlaps with a desired signal, thereby generating a DC component. Such a DC component is generated by a self-mixing operation.

As the simplest technique for removing the DC component, an AC coupling capacitor may be connected to the output stage of the active circuit. In this case, part of the desired signal component is deleted. In other words, a notch takes place.

Thus, a carrier-to-noise (C/N) characteristic may be improved for an FSK signal with a high modulation index of which a desired signal component is small in the vicinity of the DC region.

A technique for removing a DC offset using an AC coupling capacitor has been proposed. This technique can be effectively used for a two-value FSK signal with a high modulation index for pagers. Since a signal component in the vicinity of the DC region is small, the AC coupling capacitor does not largely attenuate a signal component.

However, in an FSK signal and a four-value FSK signal that have been used for high speed data transmission in recent years and that have low modulation indexes, since there are many signal components in the vicinity of the DC region, the second problem cannot be practically solved.

Such a DC offset that takes place in the receiving portion has a problem in the heterodyne system. This problem is much serious in the direct conversion system that has been used in the mobile communication field in recent years. The problem of the DC offset in the direct conversion system has different features from the problem in the heterodyne system. Next, the features of the problem in the direct conversion system will be described.

In the direct conversion system, an external radio signal (RF signal) and a local signal with the same frequency thereof are sent to a mixer so as to directly convert an RF signal into a baseband signal.

When the mixer is mathematically ideal, the isolation between each terminal is infinite. Thus, a signal supplied to a particular terminal does not take place at other terminals.

However, since a mixer used in the direct conversion type portable telephone apparatus does not have an infinite isolation, a local signal of the portable telephone apparatus is radiated from the antenna. The local signal radiated from the antenna is reflected by an external reflector. The reflected signal is received by the antenna and then sent to the mixer. Since the frequency of the signal that is sent to the mixer from the antenna is the same as the frequency of the local signal, a multiplying operation as a mixing function causes a DOC component (namely, a DC offset) to take place at a baseband output terminal.

Since the DC offset varies depending on the amount of reflection of the local signal (namely, a reflector in the vicinity of the antenna), this DC offset more adversely affects the reception characteristic than a DC offset of the portable telephone apparatus and a DC offset of an active device.

Since the direct conversion type portable telephone apparatus is small, the user carries it with his/her hand, bag, and pocket, the situation of an external reflector varies time by time. Thus, since the amount of reflection of a local signal varies time by time, the DC offset varies time by time. Since the DC offset cannot be suppressed, the reception sensitivity deteriorates.

To compensate the DC offset, a capacitor may be disposed in a downstream circuit. Since the capacitance of the capacitor is constant, a time-varying transient response of the DC offset largely affects a reception error rate.

Thus, the conventional receiving portion cannot solve the two problems with respect to the low current consumption and the improvement of the reception characteristic. In particular, the problems in the direct conversion system are severer than the problems in the heterodyne system.

Next, the problem of the synthesizer of the conventional portable telephone apparatus will be described.

In the conventional portable telephone apparatus, a frequency synthesizer is used. The frequency synthesizer comprises a reference oscillator, a reference frequency divider, a phase comparator, a loop filter, a VCO, and a comparing frequency divider. The frequency of the comparing frequency divider is varied from N1 to N2 so as to switch a frequency. The frequency switching time depends on a natural angular frequency con and a dumping coefficient $\zeta$ of the loop of the loop filter. When the natural angular frequency and dumping coefficient are selected for a stable oscillation frequency and low noise, the frequency switching time becomes long.

The frequency synthesizer of this type should have a low phase-to-noise characteristic, the frequency switching time becomes long. Thus, when the conventional frequency synthesizer is used for a TDMA type portable telephone apparatus, the apparatus cannot search a blank channel using a blank slot in the communicating state.

Next, the transmitting portion of the conventional portable telephone apparatus will be described.

The transmitting portion of the conventional portable telephone apparatus comprises a frequency converter, a variable attenuator, a power amplifier, a transmission power controlling circuit, a transmission/reception switch, a band pass filter, a directional coupler, and a power detector. The frequency converter, the variable attenuator, the power amplifier, the transmission power controlling circuit, the transmission/reception switch, and so forth can be easily structured as an IC device. Thus, the sizes of these structural parts have been decreased corresponding to the advancement of the IC technologies.

However, since it is difficult to structure the band pass filter and the directional coupler as an IC device, these parts should be mounted on a mother board.

For example, the directional coupler is a chip part with a size of 5 mm×0.5 mm. On the other hand, the power detector is structured as a diode switch having a diode, a capacitor, a resistor, and so forth. Due to the mounting areas of the diode, capacitor, resistor, and so forth, the size of the power detector exceeds 5 mm.×5 mm.

Thus, unlike with the requirement of the size reduction, the volume of the portable telephone apparatus adversely increases. In addition, since the directional coupler wastes an output power, the output power of the power amplifier should be increased so as to compensate the wasted power. Consequently, the power consumption of the transmitting portion increases.

Next, the problems of the antenna of the conventional portable telephone apparatus will be described.

To improve the portability of the portable telephone apparatus, the sizes of the battery and antenna have been remarkably decreased. However, the size of the circuit of the portable telephone apparatus has not been sufficiently decreased. Thus, considering the decrease of the overall size of the portable telephone apparatus, the size of the antenna should be further decreased.

On the other hand, there are problems of the body of the user against the antenna. The body of the user absorbs or scatters a radio frequency wave. In addition, the body causes the operating impedance of the antenna to vary. From a view point of a radio frequency, the body functions as a radio wave absorber with a high dielectric constant. Thus, the body of the user causes the radiation characteristic of the antenna to deteriorate.

Since the size and thickness of the portable telephone apparatus have been decreased, the ear of the user tend to further approach to the antenna, resulting in causing the antenna characteristic to further deteriorate.

As one of factors of such a deterioration, the body of the user causes the impedance of the antenna to fluctuate. This situation will be described assuming that the antenna is used for transmitting a signal.

To cause the antenna to radiate a radio wave, a power should be supplied to the antenna. The optimum condition of the power supplied to the antenna is in that the impedance of the feeder line is equal to the impedance of the antenna. When the impedance of the antenna fluctuates from its optimum value, a power on the feeder line is reflected at the input edge of the antenna to the transmitting amplifier. This reflection sometimes causes the amplifier to oscillate.

Next, a technique that can solve such problems and that can be easily analogized and problems involved in the technique will be described. To suppress the power from being reflected at the input edge of the antenna, the frequency band of the antenna is widened. In other words, even if the input impedance fluctuates due to the approaching of the body of the user, the fluctuation of the wide frequency band antenna is smaller than that of a narrow frequency band antenna. However, when the frequency band of the antenna is widened, the volume of the antenna should be increased. Thus, the technique for widening the frequency band of the antenna contradicts with the decrease of the size of the portable telephone apparatus.

As another technique for suppressing the reflection of the power at the input edge of the antenna, the impedance of the antenna is adjusted in such a manner that when the body of the user approaches the portable telephone apparatus the impedance becomes optimum. However, it cannot be said that this technique is not unconditionally good. This is because the portable telephone apparatus is not always used in the state that the body of the user approaches the portable telephone apparatus. Since the user carries the portable telephone apparatus with his/her hand or bag, the operation state thereof varies time by time. Thus, the amount of fluctuation of the impedance of the antenna varies corresponding to the operation state of the portable telephone apparatus. This is because the substance and distance of the body of the user to the portable telephone apparatus vary corresponding to the operation state thereof. When the amount of fluctuation varies, it is very difficult to optimally adjust the impedance of the antenna.

A part of the body that most approaches the antenna is an ear of the user. However, the size of the ears varies person by person. The difference of the size of the ears largely affects the performance of the antenna. The ears of the user cause the impedance of the antenna to largely fluctuate. This is because the dielectric constant of ears is as high as 80. When an ear of the user approaches the antenna, the electrical length of the antenna largely varies. Depending on whether or not an ear contacts the antenna or whether the ear is close to or far apart from the antenna, the impedance largely varies. The relative position of an ear to the antenna largely depends on the size of the ear. Thus, even if the impedance is optimized in the state that the body of the user approaches the antenna, the optimized antenna may be not optimum for other people. Thus, the performance of the antenna deviates person by person.

Besides the above-described techniques, there are several techniques for optimally controlling the matching circuit corresponding to the operation state.

As the first technique, a matching circuit of the antenna is switched to the other corresponding to the on/off state of a call button. This technique is based on the assumption that when the call button is turned on, an ear of the user is close to the antenna.

Although this technique can be accomplished with a simple structure, it cannot deal with the variation of the size of ears of each user.

As the second technique, the level of a wave reflected from the antenna is detected and a matching circuit of the antenna is switched to the other corresponding to the amount of reflection.

However, in this case, to detect the amount of reflection, it is necessary to place a probe between the antenna and the radio circuit. This probe may cause a reflection loss, a conductor loss, and/or a loss of an RF signal to take place.

Thus, according to the above-described conventional portable telephone apparatus, in the receiving portion, the maximum current should be always supplied. Thus, the current consumption is excessive large. When a DC offset is removed with an AC coupling capacitor, a desired signal component is also attenuated. In addition, there is a time-varying DC offset that is caused by a reflection of an external reflector and that cannot be removed by an AC coupling capacitor. Thus, the deterioration of the reception sensitivity cannot be suppressed.

In addition, the synthesizer cannot search a blank channel with a blank channel slot in the communicating state.

In the transmitting portion, the mounting sizes of circuit parts such as a directional coupler and a power detector other than an antenna are large. Thus, the size of the portable telephone apparatus cannot be further decreased.

In the antenna, when the user who carries the portable telephone apparatus approaches the antenna, the antenna characteristic deteriorates. To solve this problem, the size of the antenna should be increased. Alternatively, the user should be selected for the antenna.

SUMMARY OF THE INVENTION

The present invention is made from the above-described point of view.

A first object of the present invention is to decrease the power consumption.

A second object of the present invention is to remove a time-varying DC offset and improve the reception sensitivity.

A third object of the present invention is to decrease the mounting size of the transmitting portion.

A fourth object of the present invention is to maintain the performance of the antenna without need to increase the size thereof and select the user.

To accomplish the above-described objects, a first aspect of the present invention is a radio apparatus, comprising receiving means for receiving a radio signal in a system band used in a radio system, a synthesizing means for sending at least all desired frequency signals in the system band to the receiving means, a blank channel detecting means for detecting a blank channel of the system band, and a controlling means for widening a loop band width of a PLL (Phase Lock Loop) of the synthesizing means while the blank channel detecting means is detecting a blank channel.

A second aspect of the present invention is a radio apparatus for repeatedly transmitting and receiving a predetermined number of slots with a plurality of radio frequency signals available in a radio system band and data communication using a blank slot, comprising a phase synchronizing circuit having a phase comparator for generating a voltage corresponding to the phase difference between the phase of a reference signal and the phase of a comparing frequency divided signal, and a voltage controlling oscillator for generating a frequency corresponding to a control voltage, a first loop filter for causing the phase synchronizing circuit to perform a phase synchronizing operation at predetermined speed, a second loop filter for causing the phase synchronizing circuit to perform the phase synchronizing operation at higher speed than the predetermined speed, and a loop filter selecting means for connecting the first loop filter to the voltage controlling oscillator in the period of one of the slots that is used for a communication and for connecting the second loop filter to the voltage controlling oscillator when the period of the slot is over.

A third aspect of the present invention is a radio apparatus having a frequency converter, a low frequency amplifying, and an analog/digital converter for directly converting the frequency of an RF signal received by an antenna into a baseband signal, comprising a reflection detecting means for detecting at least one of a reflection coefficient of the antenna and a reflection power of the power amplifier when an RF signal is transmitted, and a controlling means for controlling at least one of DC offsets of the frequency converter, the low frequency amplifier, and the analog/digital converter corresponding to the antenna reflection coefficient or the antenna reflection power detected by the reflection detecting means.

A fourth aspect of the present invention is a radio apparatus having a frequency converter, a low frequency amplifying, and an analog/digital converter for directly converting the frequency of an RF signal received by an antenna into a baseband signal, comprising a reflection detecting means for detecting at least one of a reflection coefficient of the antenna and a reflection power of the power amplifier when an RF signal is transmitted, a storing means for storing the value of the reflection coefficient or reflection power detected by the reflection detecting means, and a controlling means for controlling at least one of DC offsets of the frequency converter, the low frequency amplifier, and the analog/digital converter corresponding to the antenna reflection coefficient or the antenna reflection power stored in the storing means when the RE signal is received.

A fifth aspect of the present invention is a radio apparatus, comprising a transmitting portion having a power amplifier for sending a radio signal to an antenna, a receiving portion for receiving a radio signal from the antenna, a transmission/reception switch for selecting one of the transmitting portion or the receiving portion, a transmission power detecting means, connected or capacitance-coupled to a power supply portion of the power amplifier of the transmitting portion, for detecting a transmission power corresponding to a fluctuation of the power supply portion, the fluctuation taking place when a radio signal is transmitted, and a controlling means for determining a transmission power of the transmitting portion corresponding to a transmission power detected by the transmission power detecting means.

A sixth aspect of the present invention is a radio apparatus, comprising a radio circuit for sending a signal to be transmitted to an antenna through a transmitting amplifier, a power supply circuit for sending a power to the radio circuit and the transmitting amplifier through a feeder, an ampere meter connected to the feeder, and an antenna characteristic varying means for varying a matching characteristic of the antenna corresponding to a current value detected by the ampere meter.

According to the present invention, with respect to the first problem of the receiving portion, a power detecting function for detecting the power of a desired frequency band and a power detecting function for detecting the power of the system frequency band are disposed. With these functions, it is determined whether or not the radio apparatus is in the worst radio wave environment. With the determined result, the current consumption of the receiving portion is controlled. The determination is made with reference to data stored in a storing device.

With respect to the second problem of the receiving portion, a digital signal processing portion has an AC capacitor so as to amplify a signal corresponding to the amount of attenuation of each frequency.

With respect to the third problem of the receiving portion, a control signal detecting portion has a controlling portion that detects a reflection coefficient of the antenna or a reflection power of a power amplifier in the transmission state and controls a DC offset of a frequency converter, a low frequency amplifier, or an analog/digital converter corresponding to the detected signal.

Alternatively, the controlling portion stores the reflection coefficient of the antenna or the reflection power signal of the power amplifier detected in the transmission state to the storing device and controls the DC offset of the frequency converter, the low frequency amplifier, or the analog/digital converter corresponding to the reflection coefficient or reflection power signal stored in the storing device.

Alternatively, the controlling portion subtracts a value corresponding to the reflection coefficient of the antenna detected by the control signal detecting portion or a value corresponding to the reflection power of the power amplifier from a value detected by the analog/digital converter or adds these values. Thus, according to the present invention, even if the situation of a reflection in the vicinity of the antenna varies, the fluctuation of the DC offset can be suppressed, thereby preventing the reception sensitivity from deteriorating.

With respect to the problem of the synthesizer, when the synthesizer detects a blank channel, the loop band is widened in comparison with that in the communicating state.

With respect to the first problem of the transmitting portion, to decrease the mounting areas of a directional coupler and a power detector, a power coupler and a power detector that do not always have directional characteristics are structured in a power amplifier IC chip or a transmission/reception switch IC chip. Thus, the size of the transmitting portion can be decreased.

As a signal for detecting a transmission power, a signal proportional to the transmission power generated in such an IC chip is used. With respect to the second problem of the transmitting portion, the amount of fluctuation of the power supply portion is detected.

With respect to the problem of the antenna, a current that flows in a feeder line of a transmitting amplifier is measured. Corresponding to the measured current value, the matching characteristic of the antenna is varied.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, an embodiment of the present invention will be described.

Figure 1:
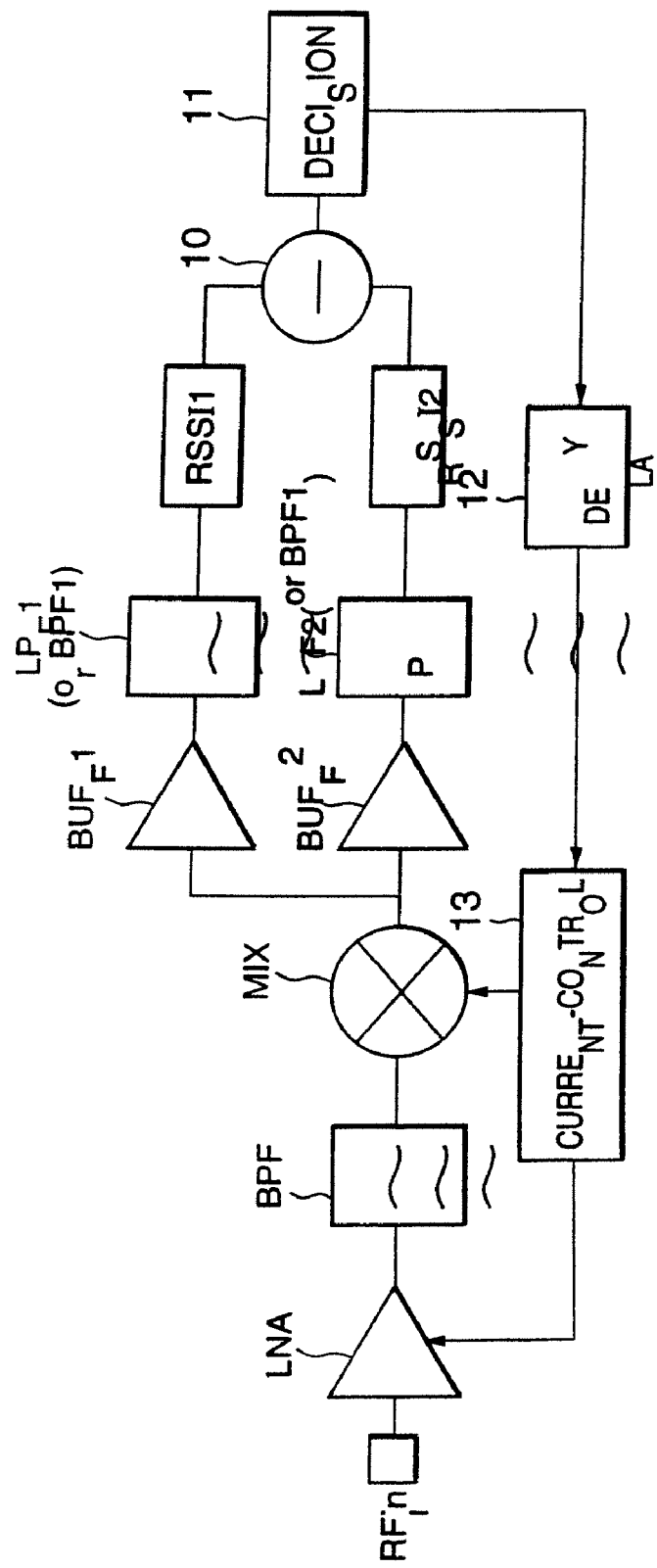
FIG. 1 is a block diagram showing a structure for detecting the power of a system band and the power or a desired wave and decreasing the power consumption of a receiving portion according to the present invention.

FIG. 1 is a block diagram showing the structure of a receiving portion of a direct modulation type portable radio apparatus (hereinafter simply referred to as radio apparatus) according to an embodiment of the present invention. In the following description, the direct demodulation type radio apparatus will be described. However, the present invention can be applied to a heterodyne type radio apparatus and so forth.

As shown in FIG. 1, the radio apparatus comprises a low noise amplifier (hereinafter referred to as LNA), a band pass filter (hereinafter referred to as BPF), a mixer (as a frequency converting means) (hereinafter referred to as MIX), buffer amplifiers (hereinafter referred to as BUFF1 and BUFF2), low pass filters (hereinafter referred to as LPF1 and LPF2), power detectors (hereinafter referred to as RSSI1 and RSSI2 (RSSI: Received Signal Strength Indicator)), a subtracting device 10, a determining device 11, a delaying device 12, and a current controlling means 13.

The LPF1 passes a predetermined signal band of the system band. In the case of the PHS (Personal Handyphone System) used in Japan, the predetermined band is around 100 kHz band. The RSSI1 detects the power of the signal band. The LPF2 passes all the system band. The LPF2 should be a filter that passes all frequencies of at least the system band. The RSSI2 detects the power of the system band. The delaying device 12 delays an input signal so as to control the signal from the next frame or slot. Instead of the LPF1 and LPF2, band pass filters (hereinafter referred to as BPF1 and BPF2) may be used. In addition, instead of the subtracting device 10, a dividing device may be used.

To decrease the amount of a current that flows in the circuit block of the receiving portion, it is necessary to determine that the radio apparatus is not in the worst radio wave environment. To do that, the RSSI1 and RSSI2 are provided. The RSSI1 detects the power of the desired band.

In contrast, the RSSI2 detects the power of the system band.

The determining device 11 obtains the difference of the power detected by the RSSI1 and the power detected by the RSSI2 or the ratio thereof so as to determine whether or not the radio apparatus is in the worst radio wave environment. There is no assurance of the normal operation of the circuit in the case that the amount of current is halved in the non-worst radio wave environment. Thus, the difference of the power detected by the RSSI1 and the power detected by the RSSI2 or the ratio thereof are divided into several levels and supplied to the LNA and the MIX. The distortion characteristic of the circuit block corresponding to the designated current corresponding to the difference or ratio of the RSSI1 and RSSI2 is written to a table stored in a memory (not shown) of the determining device 11 beforehand. With reference to the designated current value on the table, a relevant current is supplied to the LNA and the MIX. When the number of levels of the current to be designated is small, it is not always necessary to reference the table.

Next, with reference to the flow chart shown in FIG. 2, the operation of the receiving portion will be described.

It is assumed that each frame has one reception slot. With only the reception slot, the current is controlled. In addition, for simplicity, the levels of the current to be designated are only two modes that are a normal current (for the worst radio wave environment) mode and a low current mode.

Figure 2:
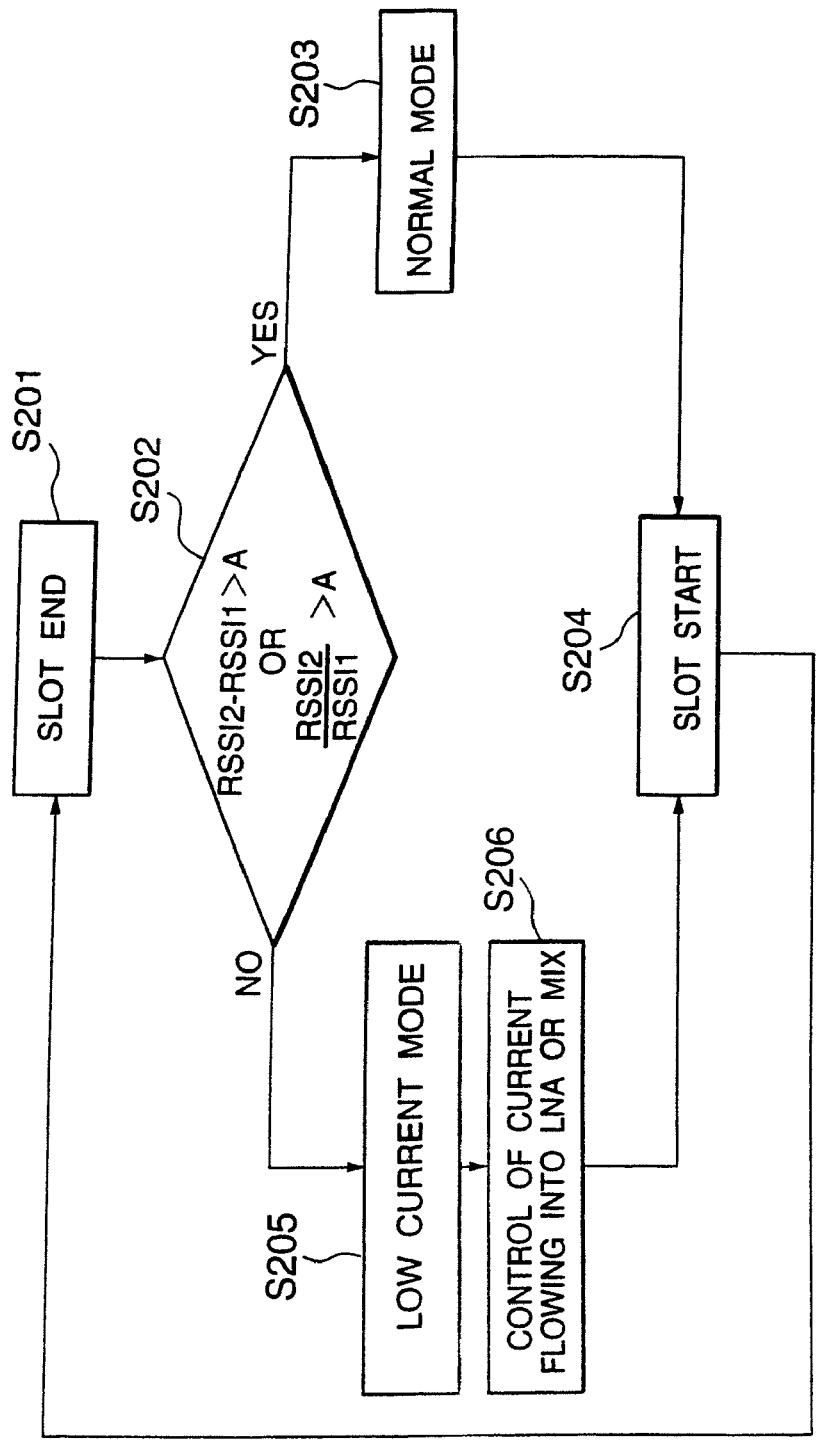
FIG. 2 is a flow chart showing a controlling process of the structure for decreasing the power consumption of the receiving portion according to the present invention.

As shown in FIG. 2, in the receiving portion, the RSSI1 detects the power in the desired band at a slot end (at step S201). On the other hand, the RSSI2 detects the power in the system band. The RSSI1 and the RSSI2 send the detected powers to the subtracting device 10.

The subtracting device 10 subtracts the power detected by the RSSI1 from the power detected by the RSSI2 and sends the subtracted result to the determining device 11. When the dividing device is used instead of the subtracting device 10, the dividing device divides the power detected by the RSSI2 by the power detected by the RSSI1 and sends the divided result to the determining device 11.

The determining device 11 determines whether or not the subtracted result or the divided result is equal to or larger than a predetermined value A (at step S202).

When the subtracted result is equal to or larger than the predetermined value A (namely, the determined result at step S202 is Yes), the determining device 11 determines that the radio wave environment is bad and designates the normal current mode (in which the normal current is supplied) (at step S203). The determining device 11 applies the determined result to the next reception slot (at step S204).

When the subtracted value or the divided value detected at the next reception slot is smaller than the designated value A (namely, the determined result at step S202 is No), the determining device 11 designates the low current mode (at step S205) so as to decrease the amount of currents that flow in the LNA and the MIX (at step S206).

To decrease the amount of current, the resistance or defined voltage of a bias circuit (not shown) that designates a bias current of the LNA and the MIX is varied. In the following description, the amount of current is decreased in the above-described manner.

In this embodiment, the amount of current is detected each frame prior. Alternatively, the amount of current may be detected one slot prior. In this case, the difference of the output level of the desired wave detected one frame prior and the output level of the system band of the current frame or the ratio thereof is obtained.

To accomplish the present invention, it is preferable to designate the normal current level as the initial current level. However, when a blank channel is detected, if all channels are blank, it can be estimated that there is no unnecessary wave in the system. Thus, in this case, the low current level can be designated as the initial level.

On the other hand, since the LPF2 passes all the system band, the ratio of the system band to the desired wave is large. Thus, white noise (or thermal noise) increases in the LPF2.

When the white noise increases, the determining device 11 may mistaken the number of radio waves in the system. To solve this problem, the power component of the white noise with a widened band is subtracted from the value detected by the RSSI2 so as to compensate the value of the power detected by the RSSI2. As a compensating technique, the power component is simply subtracted from the value of the power detected by the RSSI2. Alternatively, the value of the power detected by the RSSI2 may be compensated using a table containing the power component of the white noise.

Figure 3:
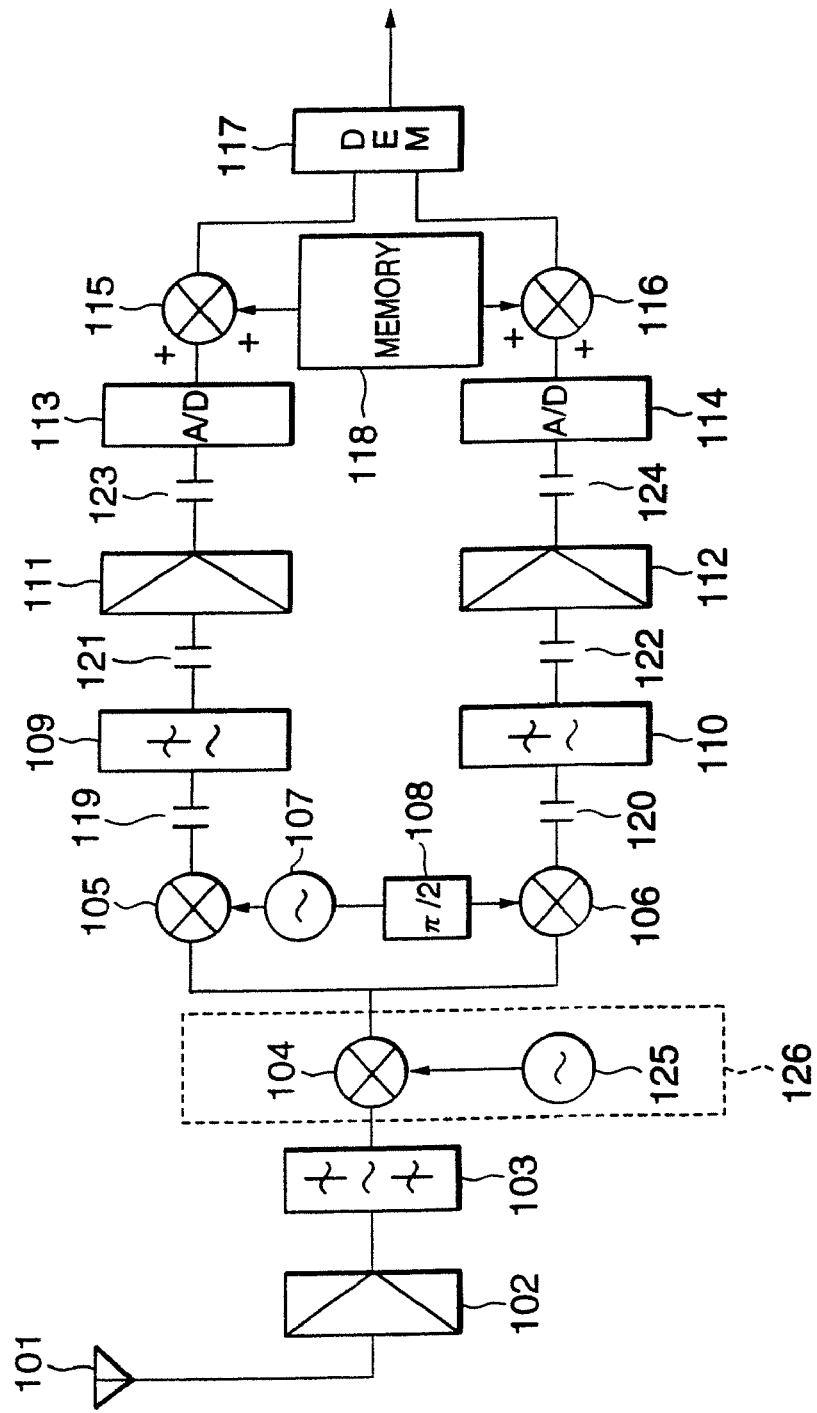
FIG. 3 is a block diagram showing an example of the structure of the receiving portion having a self compensating function according to the present invention.

FIG. 3 is a block diagram showing the receiving portion of the radio apparatus according to another embodiment of the present invention.

Referring to FIG. 3, the radio apparatus comprises an antenna 101, a radio frequency amplifier 102, a radio frequency filter 103, a frequency converter 104, frequency converters 105 and 106, a local oscillator 107, a .pi./2 phase shifter 108, low frequency filters 109 and 110, low frequency amplifiers 111 and 112, A/D converters 113 and 114, multiplying devices 115 and 116, a memory 118 (as a storing means), capacitors 119 to 124, and a local oscillator 125. The memory 118 stores an inverse characteristic of an overall AC-coupled frequency characteristic of the baseband portion from the frequency converter 105 to the A/D converter 113 and an inverse characteristic of an overall AC-coupled frequency characteristic of the baseband portion from the frequency converter 106 to the A/D converter 114.

The radio frequency amplifier 102 improves the noise figure of the radio portion. A circuit block composed of the frequency converters 105 and 106, the local oscillator 107, the .pi./2 phase shifter 108, and so forth is referred to as an orthogonal demodulating portion. The capacitors 119 to 124 connected to a downstream stage of the frequency converters 105 and 106 are disposed so as to remove a DC component.

In this receiving portion, a radio frequency signal received from the antenna 101 is sent to the radio frequency amplifier 102. The radio frequency amplifier 102 amplifies the radio frequency signal with a predetermined gain. The amplified signal is sent to the frequency converter 104 through the radio frequency filter 103 that is an image suppressing filter.

On the other hand, the local oscillator 125 generates a reference carrier signal and sends the reference carrier signal to the frequency converter 104. The frequency converter 104 multiplies the received signal by the reference carrier signal and thereby converts the received signal into an intermediate frequency signal. The intermediate frequency signal is converted into a baseband signal by the orthogonal demodulating portion composed of the frequency converters 105 and 106, the local oscillator 107, and the .pi./2 phase shifter 108. In other words, the two frequency converters 105 and 106 generate two baseband signals of I and Q channels that have the same frequency as the intermediate frequency signal sent from the local oscillator 107 and that have a phase difference of .pi./2.

The baseband signal of I channel obtained from the frequency converter 105 is sent to the low frequency filter 109 through the capacitor 119. The low frequency filter 109 performs the anti-aliasing process for the baseband signal, of I channel. The resultant signal is sent to the low frequency amplifier 111 through the capacitor 121. The low frequency amplifier 111 amplifies the received signal with a predetermined gain. The amplified signal is sent to the A/D converter 113 through the capacitor 123. The A/D converter 113 converts the received signal as an analog signal into a digital signal. The resultant digital signal is sent to the multiplying device 115.

On the other hand, as with the baseband signal of T channel, the baseband signal of Q channel obtained from the frequency converter 106 is sent to the multiplying device 116 through the capacitor 120, the low frequency filter 110, the capacitor 122, the low frequency amplifier 112, the capacitor 124, and the A/D converter 114. The low frequency filters 109 and 110 may select a channel.

An inverse characteristic of the overall AC-coupled frequency characteristic of the baseband portion from the frequency converter 105 to the A/D converter 113 is sent from the memory 118 to the multiplier 115 of I channel in synchronization with the digital signal. The multiplier 115 multiplies the signal received from the A/D converter 113 by the inverse characteristic received from the memory 118.

An inverse characteristic of the overall AC-coupled frequency characteristic of the baseband portion from the frequency converter 106 to the A/D converter 114 is sent from the memory 118 to the multiplier 116 of Q channel in synchronization with the digital signal. The multiplier 116 multiplies the signal received from the A/D converter 114 by the inverse characteristic received from the memory 118.

The detector 117 demodulates the multiplied signals received from the multiplier 115 of I channel and the multiplier 116 of Q channel into original data.

Next, individual signals with respect to the above-described operation will be described.

Figure 4:
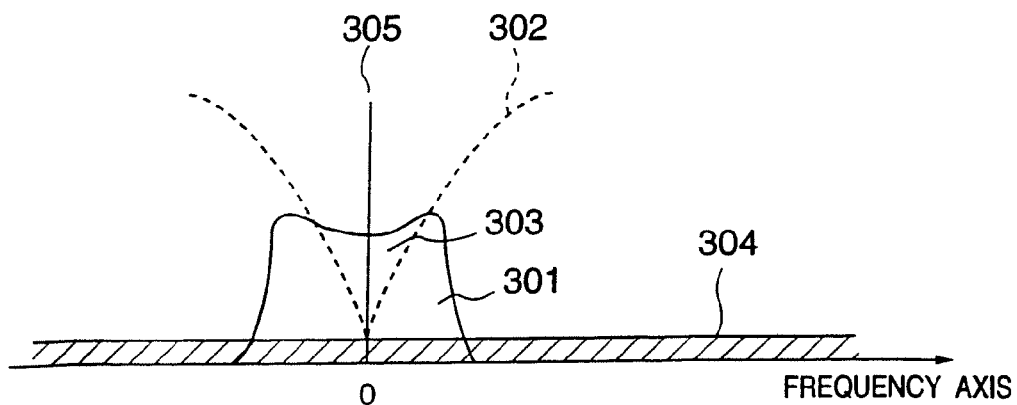
FIG. 4 is a graph showing a frequency characteristic of an output signal of a frequency converter.

As shown in FIG. 4, a desired baseband signal (hereinafter referred to as desired wave) obtained from the frequency converters 105 and 106 overlaps with a DC component 305. In FIG. 4, a hatched region represents the level of thermal noise 304.

The capacitors 119 to 124 disposed in the downstream stage of the frequency converters 105 and 106 remove the DC component 305 from the desired wave 301. The capacitances of the capacitors 119 to 124 are designated so that a frequency characteristic 302 of the desired wave 301 is obtained.

Figure 5:
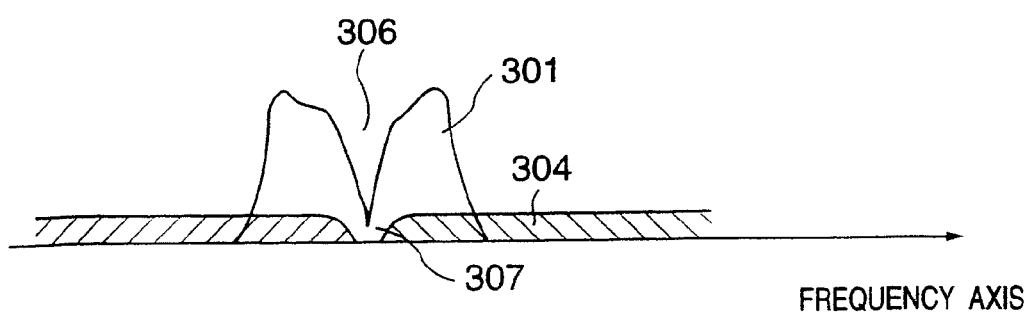
FIG. 5 is a graph showing a frequency characteristic having a notch due to an AC coupling operation.

When the DC component 305 is removed by the AC coupling capacitors 119 to 124, a signal component 303 as a part of the desired signal 301 is lost along with the DC component 305. Thus, before the desired wave 301 (namely, output signals of the A/D converters 113 and 114) is sent to the multipliers 115 and 116, as shown in FIG. 5, a notch 306 takes place in the desired wave 301. Likewise, a notch 307 takes place in thermal noise 304.

Although the output signals of the A/D converters 113 and 114 have the notch 306, since a signal component affected by the notch 306 is known, when the memory 118 stores an inverse characteristic necessary for interpolating the affected portion and the multiplying devices 115 and 116 multiply the desired wave 301 by the inverse characteristic stored in the memory 118, the original signal can be almost exactly reproduced.

Next, the inverse characteristic stored in the memory 118 will be described.

Figure 6:
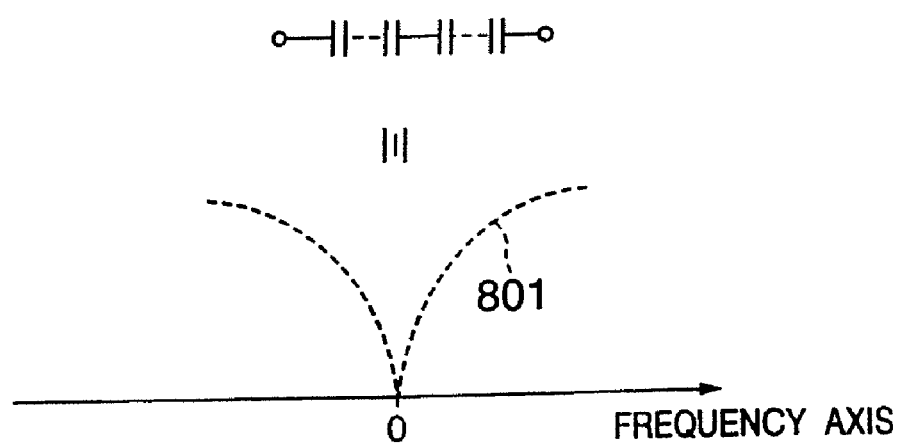
FIG. 6 is a graph showing a frequency characteristic of AC coupling capacitors.

In FIG. 6, a reference numeral. 801 represents a frequency characteristic of which baseband signals obtained from the frequency converters 105 and 106 are AC-coupled by the capacitors 119 to 124 until the signals are sent to the A/D converters 113 and 114.

Figure 7:
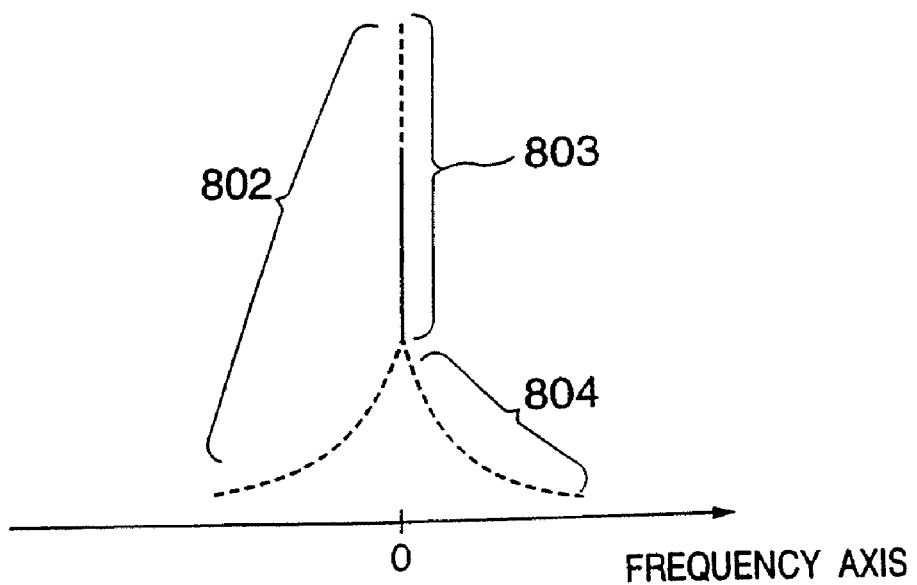
FIG. 7 is a graph showing an invert characteristic of the frequency characteristic shown in FIG. 6.

When the frequency characteristic 801 is AC-coupled, a DC component whose value is 0 takes place. An inverse characteristic of the frequency characteristic 801 is represented by reference numeral 802 as shown in FIG. 7. Since the value of the inverse characteristic 802 as a DC component is infinite, the characteristic 802 cannot be stored as data to the memory 118.

In the characteristic 802, a portion of the DC component that exceeds a predetermined level is removed and used as an inverse characteristic corresponding to the required compensation accuracy.

In an example shown in FIG. 7, a DC component 803 is removed from the inverse characteristic 802 of the frequency characteristic that has been AC-coupled. The resultant portion is treated as an inverse characteristic 804. Thus, in the desired wave 301 of which the inverse characteristic 804 has been multiplied by the output signals of the A/D converters 113 and 114, a compensation error corresponding to the limited portion of the DC component of the inverse characteristic takes place. In other words, the compensation error corresponding to the limited portion of the DC component of the inverse characteristic 804 causes notches 701 and 702 to take place in the desired wave 301 and the thermal noise 304, respectively.

However, it is clear that the unnecessary DC component has been completely removed and that the notch 701 of the signal component is more alleviated than the notch 306 shown in FIG. 5. Since the DC offset of I channel is different from the DC offset of Q channel, the self compensating operation should be performed for each of I and Q channels. An advantage of the self compensating function of the DC component is in that its effect is not lost even if the reference carrier frequency obtained from the local oscillator 107 shown in FIG. 3 is offset from a desired value.

Figure 9:
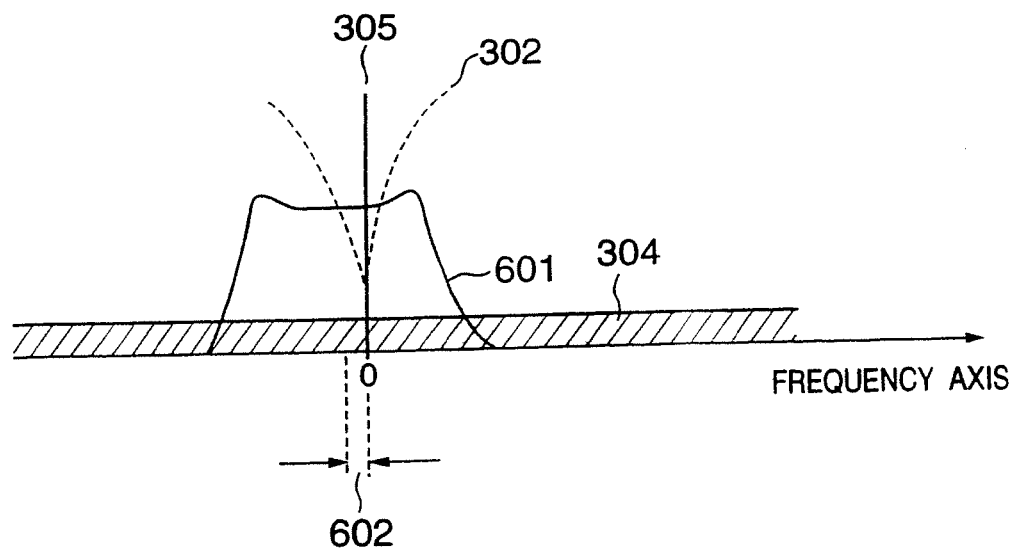
FIG. 9 is a graph showing a DC offset in the case that a local oscillation frequency de-tunes.

When the frequency obtained from the local oscillator 107 is offset from the desired value, the center frequency of the baseband signal (desired wave) obtained from the frequency converters 105 and 106 is offset from the DC component as shown in FIG. 9.

As shown in FIG. 9, the center frequency of a desired wave 601 is offset from the DC component 306 by a distance 602. The distance 602 is equal to the frequency offset against the desired frequency of the local oscillator 107. However, as is clear from FIG. 9, even if the center frequency of a signal converted to a baseband signal is offset from the DC component, theoretically the DC component is not offset. Thus, corresponding to the frequency characteristic 302 of the AC coupling capacitors 119 to 124, the DC component 305 is completely removed. Thereafter, the output signals of the A/D converters 113 and 114 are multiplied by the inverse characteristic 804 stored in the memory 118. Thus, as with the case that the local oscillator 107 does not have a frequency offset, the DC component 305 can be removed from the desired wave 301 without a large notch. The inverse characteristic 804 that have been measured can be stored in the memory 118.

Figure 10:
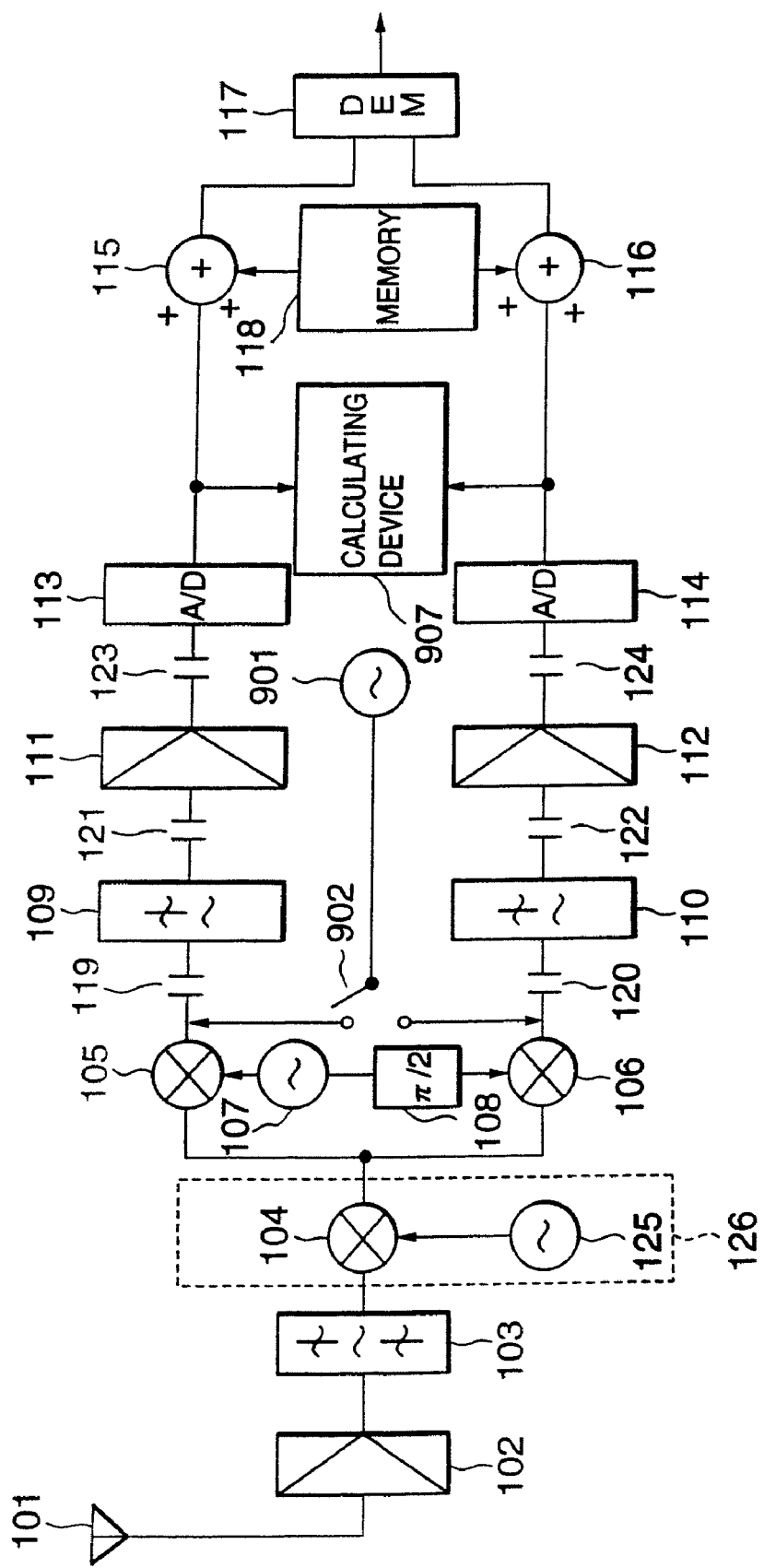
FIG. 10 is a block diagram showing another example of the structure of the receiving portion having the self-compensating function.

Next, with reference to FIG. 10, the receiving portion of the radio apparatus according to another embodiment of the present invention will be described. The receiving portion of this embodiment further comprises a sweep oscillator 910, a switch 902, and a calculating device 907. The sweep oscillator 901 is connected to the circuits of I channel and Q channel through the switch 902. The sweep oscillator 901 sweeps frequencies in the range that the frequency characteristic 801 of AC coupled signals that are output from the frequency converters 105 and 106 and the A/D converters 113 and 114 becomes flat. With the sweeping operation, the frequency characteristic 801 of the AC coupled signals of I channel and Q channel can be obtained. The obtained frequency characteristic 801 is sent to the calculating device 907 branched from the A/D converters 113 and 114. The calculating device 907 calculates the inverse characteristic 804 shown in FIG. 7 with the frequency characteristic 801 of the measured AC coupled signal. The calculated inverse characteristic 804 are stored in the memory 118. The frequency characteristic can be measured by the sweep oscillator 901 while a signal is not being received.

According to this embodiment, even if the frequency characteristic 801 of the AC coupled signal vary due to a temperature characteristic, the inverse characteristic 804 can be more flexibly obtained and the DC offset can be compensated.

In this embodiment, the heterodyne type receiving portion was described. However, a direct modulation type receiving portion can be used. In this case, a transient response of a time-varying DC offset due to a reflector cannot be handled. However, with the above-described countermeasures, a sufficient characteristic may be obtained in a particular radio system.

Next, a method for removing a time-varying DC offset caused by a reflector will be described (the time-varying DC offset is a problem to be solved in the direct conversion type radio apparatus).

Figure 11:
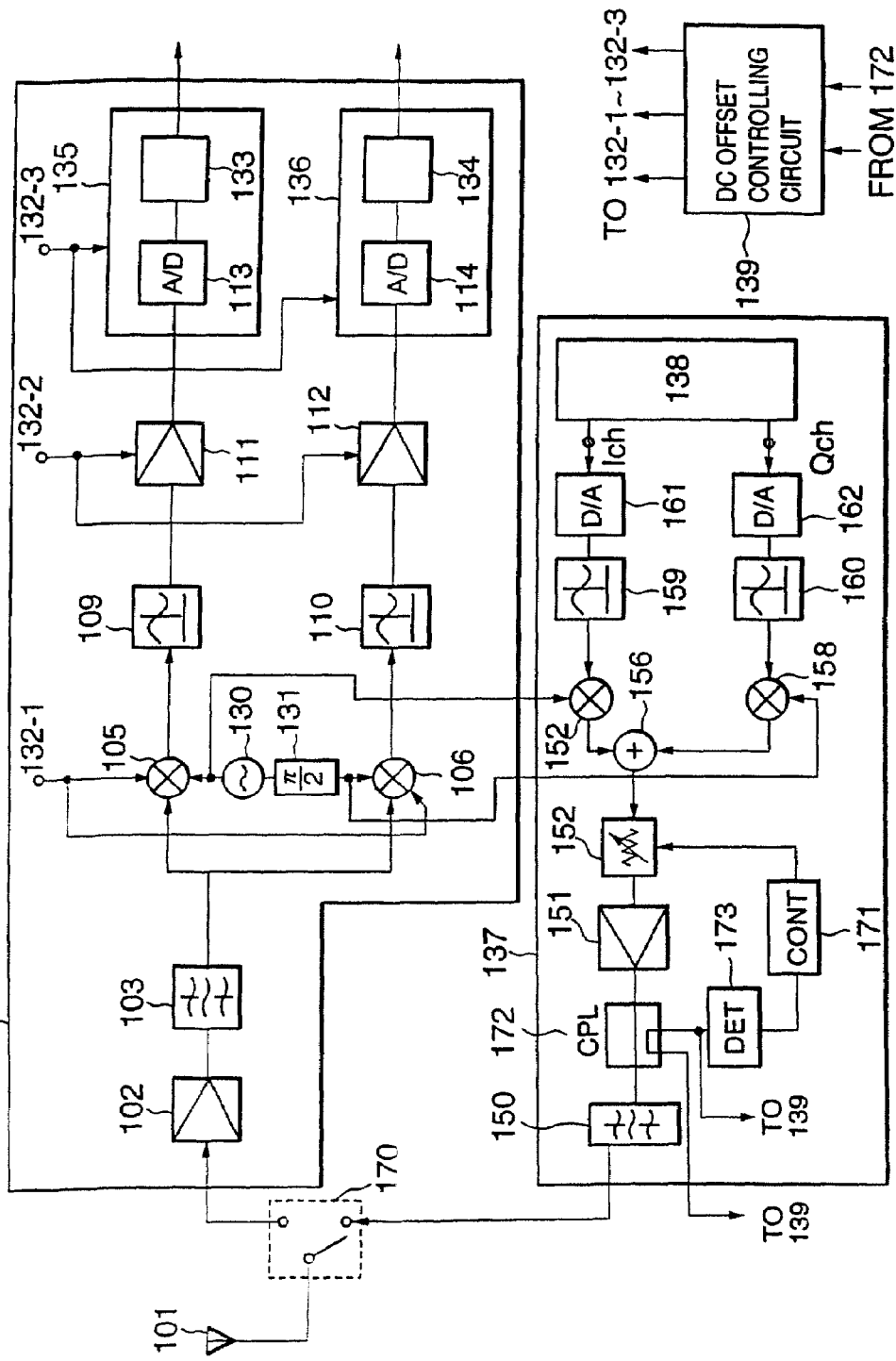
FIG. 11 is a block diagram showing the structure of a direct conversion radio apparatus according to an embodiment of the present invention.

FIG. 11 is a block diagram showing the structure of a direct conversion type radio apparatus (hereinafter referred to as radio apparatus) according to an embodiment of the present invention.

Referring to FIG. 11, the radio apparatus comprises an antenna 101, a transmission/reception switch 170, a receiving portion 129, a transmitting portion 137, and a DC offset controlling circuit 139. The receiving portion comprises a radio frequency amplifier 102, frequency converters 105 and 106, a local oscillator 130, a .pi./2 phase shifter 131, a baseband filter 109, low frequency amplifiers 111 and 112, and baseband signal processing circuits 135 and 136. The local oscillator 130 generates a local signal. Each of the frequency converters 105 and 106 has a DC offset control terminal 132-1. Each of the low frequency amplifiers 111 and 112 has a DC offset control terminal 132-2. Each of the baseband signal processing circuits 135 and 136 has a DC offset control terminal 132-3. The baseband signal processing circuits 135 and 136 have analog/digital converters 113 and 114 and adding/subtracting circuits 133 and 134, respectively.

The transmitting portion 137 comprises a band pass filter 150, a directional coupler 172, a power amplifier 151, a variable attenuator 152, a power detector 173, a power controlling circuit 171, an adding device 156, frequency converters 157 and 158, low pass filters 159 and 160, digital/analog converters 161 and 162, and a transmission signal generator 138. The DC offset controlling circuit 139 is connected to the directional coupler 172 and the control terminals 132-1, 132-2, and 132-3.

Next, the basic operation of the transmitting portion of the radio apparatus according to this embodiment will be described.

In the radio apparatus, when a signal is transmitted, the transmission/reception switch 170 is placed on the transmitting portion side. A transmission wave received from the transmission signal generator 138 is amplified by the power amplifier 151. The resultant signal is transmitted from the antenna 101 through the directional coupler 172 and the transmission/reception switch 170.

In this embodiment, the TDD system of which the frequency of the transmission signal is the same as the frequency of the reception signal will be described. When a signal is transmitted, the directional coupler 172 measures the power reflected from the antenna 101. In addition, the directional coupler 172 measures the power propagated to the antenna 101. The measured results are sent to the DC offset controlling circuit 139. The DC offset controlling circuit 139 obtains a reflection coefficient of the antenna 101 with the reflection power and the propagation power. In the TDD system, the frequency of the transmission signal is the same as the frequency of the reception signal. Thus, when a signal is transmitted, if the reflection power is large, the reflection power of a local signal in the receiving mode of the antenna 101 is large. In contrast, when the reflection power is small, the reflection power of the local signal in the receiving mode of the antenna 101 is small. Thus, when a signal is transmitted, the reflection power in the transmitting mode of the antenna 101 can be obtained. Thus, the amount of the reflection of the local signal to the receiving portion can be obtained.

When the reflection wave is large, the DC offset controlling circuit 139 sends a control signal that causes the DC offset to decrease and that is proportional to the reflected power to the DC offset control terminals 132-1 of the frequency converters 105 and 106, thereby decreasing the DC offset in the receiving portion.

In the radio apparatus according to the embodiment, when a signal is transmitted in the TDD system, the directional coupler 172 measures the propagation power to the antenna 101 and the reflection power from the antenna 101, obtains the reflection coefficient of the antenna 101 with the propagation power and the reflection power, and sends the reflection coefficient to the receiving portion. Thus, when a signal is received just after a signal is transmitted, the receiving operation is performed in the state that the DC offset is decreased due to an external reflector. Thus, the reception sensitivity at which the receiving operation is improved in comparison with the case that such a process is not performed. In addition, since a signal can be received in the state that an DC offset is decreased, it is not necessary to disposed many AC coupling capacitors in the circuit.

In the above example, the controlling operations of the frequency converters 105 and 106 were described. Alternatively, when a control signal is sent to one of the DC offset control terminals 132-2 and 132-3 of the low frequency amplifiers 111 and 112 and the analog/digital converters 113 and 114, the same effect as the case that the frequency converters 105 and 106 are controlled can be obtained. In other words, if necessary, a DC offset can be compensated in upstream stages of the frequency converters 105 and 106.

Next, with reference to FIG. 12, a radio apparatus according to a modification of the embodiment shown in FIG. 11 will be described.

Figure 8:
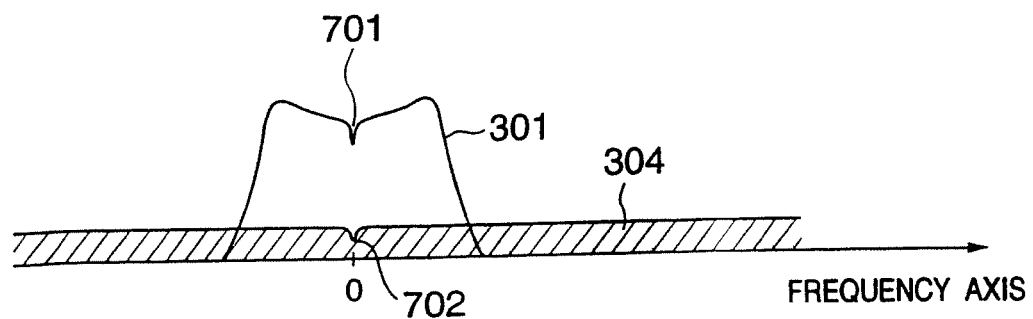
FIG. 8 is a graph showing a desired wave that has been self-compensated corresponding to the present invention.
Figure 12:
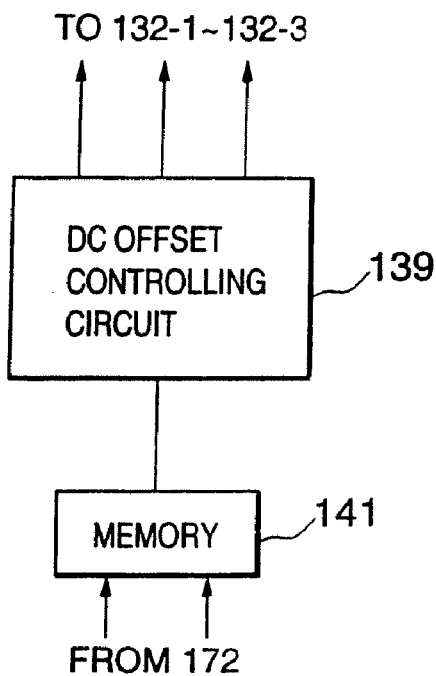
FIG. 12 is a schematic diagram showing a modification of the radio apparatus shown in FIG. 11.

As shown in FIG. 12, in this modification, a memory 141 is disposed between a DC offset controlling circuit 139 and a directional coupler 172. The memory 141 stores data for causing a control voltage corresponding to the reflection power or reflection coefficient of the antenna 101 to be generated. Thus, when the memory 141 stores control data for decreasing the DC offset corresponding to the reflection power of the antenna 101, the control data is sent to the DC offset controlling circuit 139. Thus, the DC offset controlling circuit 139 can decrease the DC offset in a shorter time period than that of the embodiment shown in FIG. 8 without need to calculate the reflection coefficient.

Figure 13:
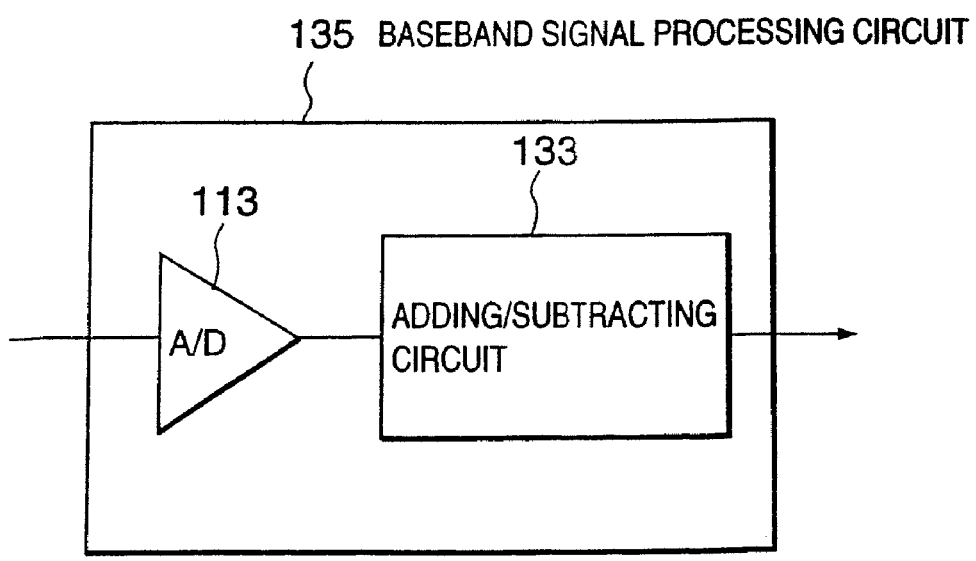
FIG. 13 is a schematic diagram showing another modification of the radio apparatus shown in FIG. 11.

Next, with reference to FIG. 13, a radio apparatus according to another modification of the embodiment shown in FIG. 11 will be described.

In this modification, a baseband signal processing circuit 135 performs a DC offset decreasing process instead of the DC offset controlling circuit 139. In FIG. 13, for simplicity, a baseband signal processing circuit 136 is omitted.

In this modification, adding/subtracting circuits 133 and 134 add (or subtract) the value corresponding to the propagation power of the power amplifier 151 and the value corresponding to the reflection power of the antenna 101 and the values received from the analog/digital converters 113 and 114 so as to decrease the DC offset. In other words, when the output values of the analog/digital converters 113 and 114 are added or subtracted, a DC value is analogously offset.

According to this modification, the same effect as the embodiment shown in FIG. 11 can be obtained without need to connect a special DC offset controlling circuit 139 to an analog circuit such as a frequency converter and a low frequency converter. In the above-described embodiment, TDD system was described. In the case that the frequency band of a transmission signal is the same as the frequency band of a reception signal, when the amount of reflection in the transmitting state is measured, the same effect can be obtained.

Next, the synthesizer of the radio apparatus of the radio apparatus will be described.

Figure 14:
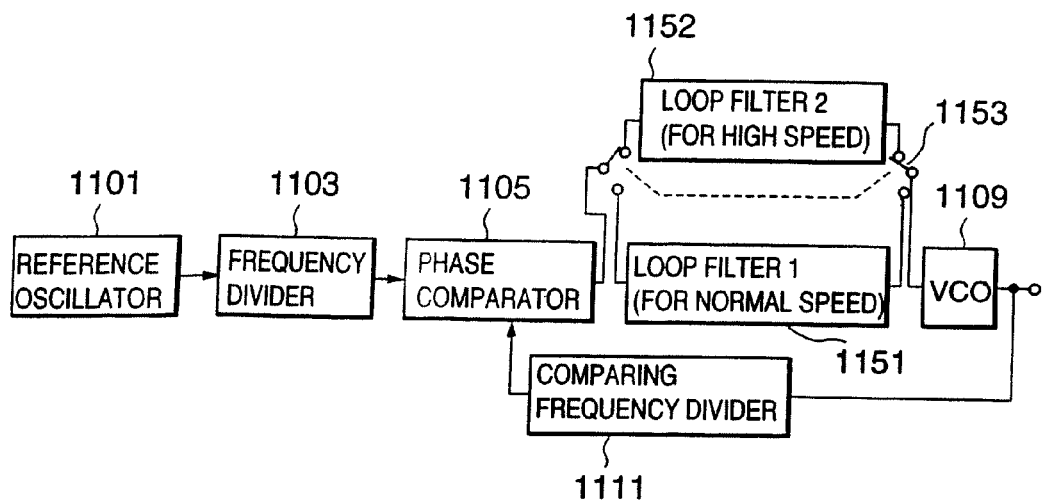
FIG. 14 is a block diagram showing the structure of a synthesizer of the radio apparatus according to an embodiment of the present invention.

FIG. 14 is a block diagram showing the structure of a synthesizer of the radio apparatus according to a first embodiment of the present invention.

Referring to FIG. 14, the synthesizer comprises a reference oscillator 1101, a reference frequency divider 1103, a phase comparator 1105, a normal mode loop filter 1151, a high speed mode loop filter 1152, a switch 1153, a VCO 1109, and a comparing frequency divider 1111. Since the basic loop operation of the synthesizer is the same as that of a conventional synthesizer, its description is omitted.

In the synthesizer according to the embodiment, when the switch 1153 is placed on the normal mode loop filter side, a normal loop mode takes place. In this case, the VCO 1109 outputs a signal with a low phase-to-noise characteristic. However, in this mode, the frequency switching operation takes a time.

On the other hand, when the switch 1153 is placed on the high speed mode loop filter side, a high speed loop mode (blank channel search mode) takes place. In this mode, although the phase-to-noise characteristic of an output signal of the VCO 1109 deteriorates, the frequency switching operation is quickly performed.

Figure 15:
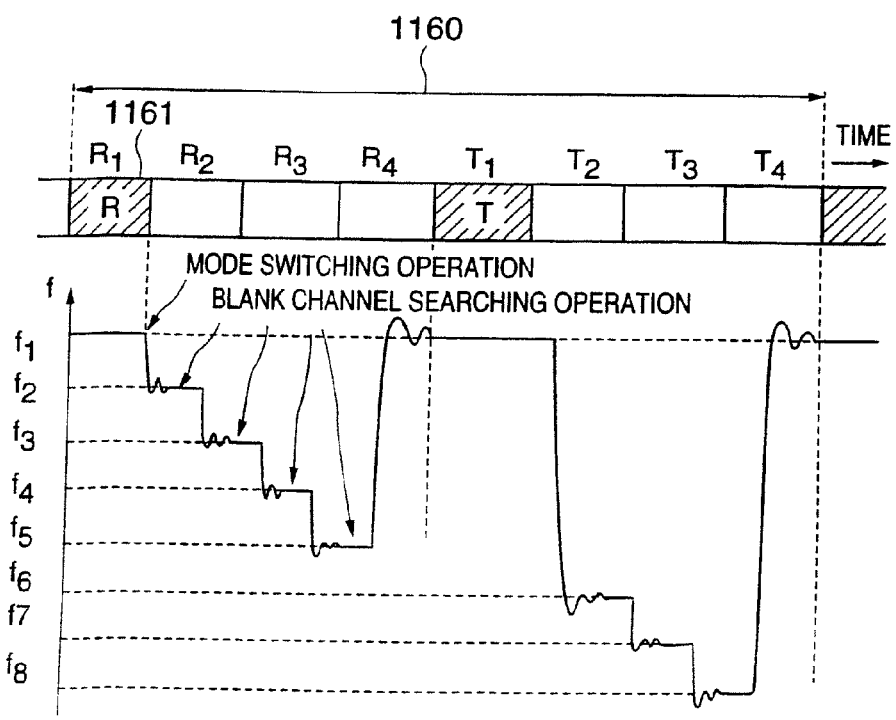
FIG. 15 is a schematic diagram for explaining a high speed blank channel searching operation of the synthesizer shown in FIG. 14.

Next, the operation of the synthesizer of the radio apparatus according to the embodiment will be described. FIG. 15 is a schematic diagram showing the structure of slots in the TDMA system.

As shown in FIG. 15, one frame 1160 is composed of four reception slots R1 to R4 and four transmission slots T1 to T4. One slot is denoted by reference numeral 1161. It is assumed that a communication is made with one reception slot R1 and one transmission slot T1. In addition, it is assumed that a frequency of a communication channel is denoted by f1.

The synthesizer searches a blank channel in the following manner.

In the period of the reception slot R1, the synthesizer operates in the normal mode with a high phase-to-noise characteristic. After the period of the reception slot R1, the switch 1153 switches the normal mode to the high speed mode.

When a frequency f2 that is different from the frequency of the communication channel is designated to the synthesizer, it searches a blank channel. Since the high speed mode has been selected, the synthesizer switches the current frequency to the desired frequency at high speed and searches a blank channel.

After the synthesizer has searched a black channel at frequency f2, it switches the frequency f2 to another frequency f3 and searches a blank channel. The synthesizer repeats such an operation and searches blank channels at a plurality of frequencies. Before the transmission slot T1 takes place, the synthesizer restores the original communication channel f1. At the same time, the synthesizer switches the high speed mode to the normal mode. In the period of the transmission slot T1, the synthesizer operates in the normal mode with the high phase-to-noise characteristic. The synthesizer repeats the above-described operation and searches blank channels during the communication. While the synthesizer is searching a blank channel, since it operates in the high speed mode, the S/N (signal-to-noise ratio) of the synthesizer is not high and thereby the reception sensitivity thereof deteriorates. However, since the phase-to-noise characteristic necessary for determining whether there is a blank channel is alleviated in comparison with that in the communicating state, the synthesizer can search a blank channel in the high speed mode. In the above-description, the loop characteristic was switched by switching the frequency characteristic of the loop filter. Alternatively, by switching the sensitivity of the phase comparator, the loop characteristic may be switched. In addition, a blank channel may be searched in for example one slot.

When the synthesizer searches a blank channel in the high speed mode, if all channels are blank, it can be determined that there is no interference wave in the vicinity of the system band. Thus, as an operation for detecting the radio wave environment, the black channel searching operation can be used. In other words, when all channels are black, the current consumption of the receiving portion can be decreased.

In this case, the searched result of a blank channel is sent to the determining device 11 shown in FIG. 1. The determining device 11 determines the current mode and controls the amount of current that flow in the LNA and the MIX.

Next, with reference to FIGS. 16 to 26, the transmitting portion will be described.

Figure 16:
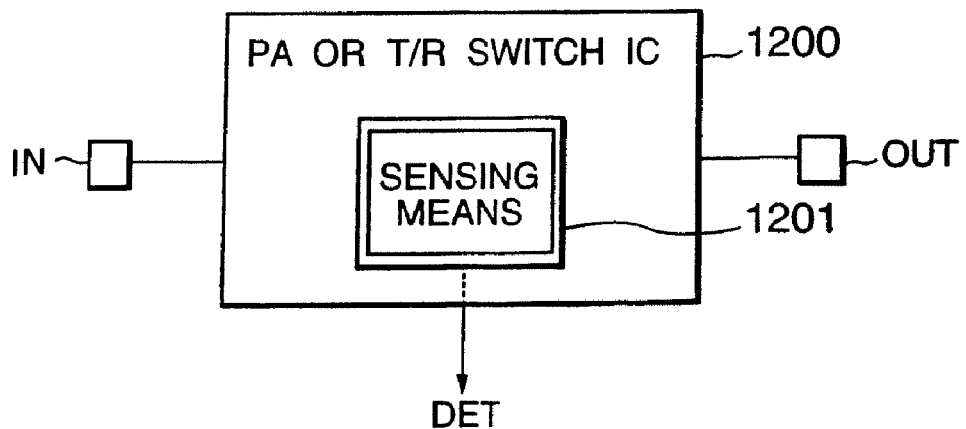
FIG. 16 is a schematic diagram showing the basic concept of a front-end radio frequency IC having a sensing means.

FIG. 16 is a schematic diagram showing the basic concept of an IC chip that has a power amplifier or a transmission/reception switch.

In FIG. 16, reference numeral 1200 is an IC chip. When the IC chip 1200 is for example a power amplifier IC chip (hereinafter referred to as PA-IC chip), RF signals received from the frequency converters 157 and 158 show in FIG. 11 are sent to an input terminal IN of the IC chip 1200. An RF signal amplified by the PA-IC chip 1200 is sent to an output terminal OUT. The IC chip 1200 has a sensing means 1201 that senses an output power. A signal proportional to the power sensed by the sensing means 1201 is sent to a power detector DET as a signal processing means from a terminal other than the output terminal OUT.

In FIG. 16, when the IC chip 1200 is a transmission/reception switch (hereinafter referred to as T/R switch), an RF signal received from the power amplifier PA is sent to an input terminal IN of the IC chip 1200. An RF signal received from a sensing means 1201 through an input terminal IN is sent to an output terminal OUT. As with the PA-IC chip, the sensing means 1201 senses a signal proportional to the power of the RF signal. The sensed signal is sent to a signal processing means (for example, an output power detector DET) from a terminal other than the output terminal OUT.

Figure 17:
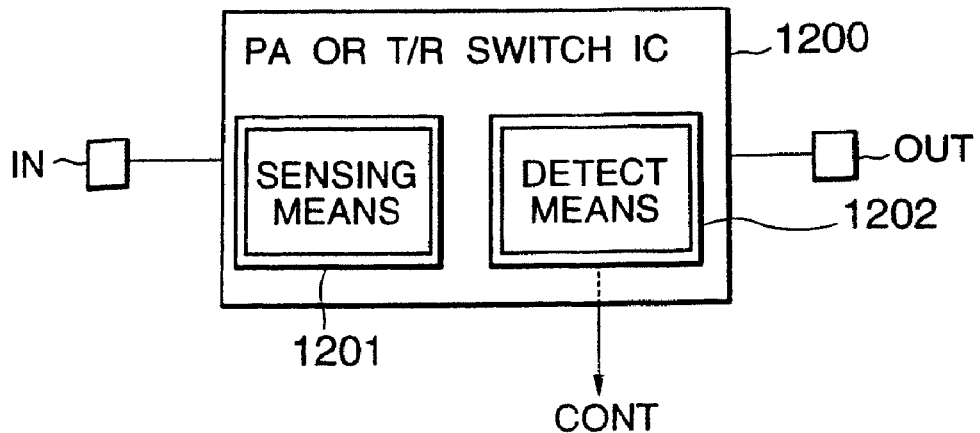
FIG. 17 is a schematic diagram showing the basic concept of a front-end radio frequency IC having a sensing means and a power detector.

Next, with reference to FIG. 17, an IC chip according to a modification of the structure shown in FIG. 16 will be described.

In the example shown in FIG. 16, the output power detector DET is disposed outside the IC chip 1200. However, in this modification, a power detecting function of an output power detector DET as a signal processing means 1202 is structured as an IC chip along with a sensing means 1201. The structure of the sensing means 1201 shown in FIG. 17 is the same as the structure of the sensing means 1201 shown in FIG. 16.

In this modification, a signal sensed by the sensing means 1201 is sent to the output power detecting means 1201 structured in the same IC chip.

The output power detecting means 1202 converts the frequency of an output power to a low frequency corresponding to a sense signal and sends a signal corresponding to the output power to a power controlling circuit (CONT) 171. Since the output power detecting means 1202 performs a signal process such as a frequency converting process, the output power detecting means 1202 is referred to as signal processing means. In FIGS. 16 and 17, the PA-IC chip or the T/R switch IC chip are not always different IC chips. Instead, either the PA-IC chip or the T/R switch IC chip may be structured as an IC chip.

Figure 18:
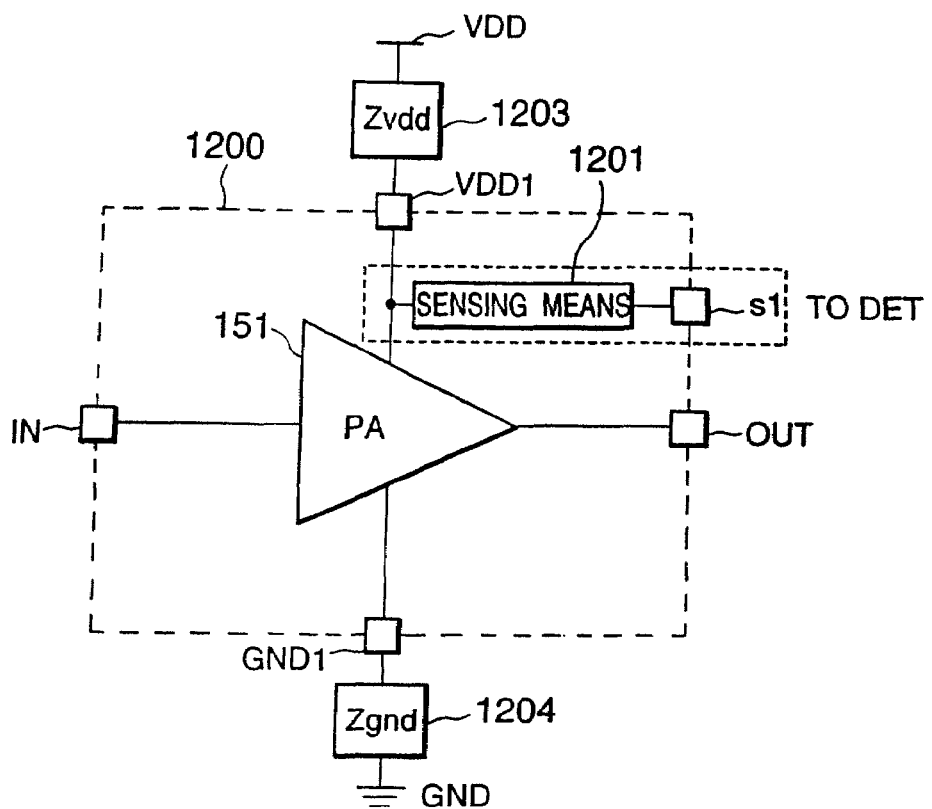
FIG. 18 is a schematic diagram showing the structure of a PA-IC chip according to an embodiment of the present invention.

FIG. 18 is a schematic diagram showing the basic concept of the structure of the PA-IC chip shown in FIG. 16.

In FIG. 18, RF signals received from frequency converters 157 and 158 are sent to a power amplifier PA 151 through an input terminal IN. An output signal of the power amplifier PA 151 is sent to a band pass filter BPF through an output terminal OUT.

A power supply terminal VDD1 in an IC chip 1200 is a terminal for supplying a power to the power amplifier PA 151. A ground terminal GND1 is a ground terminal of the power amplifier PA 151. An external ground terminal GND and an external power supply terminal VDD are separated from a terminal GND and a terminal VDD1 so as to represent a stray inductance, resistance, and capacitance that take place among circuits structured as an IC chip. In other words, a stray impedance Zvdd 1203 takes place between the terminal VDD and the terminal VDD 1. In addition, a stray impedance Zgnd 1204 takes place between the terminal GND and the terminal GND1.

In FIG. 18, a terminal s1 is a terminal for obtaining a signal proportional to the power of an RF signal of the power amplifier PA 151. The terminal s1 is connected to the power supply terminal VDD1 through a sensing means 1201 shown in FIG. 16. In this example, a signal proportional to the product of the stray impedance Zvdd 1203 and an instantaneous current of the power amplifier PA is measured at the power supply terminal VDD1. Since a varied portion of the instantaneous current of the power amplifier PA 151 is proportional to an output power of the power amplifier PA 151, an AC component measured at the terminal VDD 1 is proportional to the output power of the power amplifier PA 151.

Next, the structure of the sensing means 1201 will be described. With an AC component measured at the terminal VDD1, a signal proportional to the output power of the power amplifier PA 151 is obtained. Thus, as the simplest structure, as shown in FIG. 19, a capacitor C1 may be disposed between the terminal VDD1 and the terminal s1.

In this case, the terminal s1 is connected to a power detecting circuit DET described in the related art reference. The capacitor that does not have a directional characteristic can be used for detecting a power since a coupler that does not have a directional characteristic is not always required.

Figure 19:
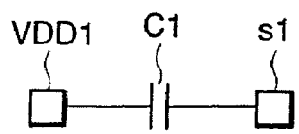
FIG. 19 is a schematic diagram showing an example of a sensing means of the PA-IC chip shown in FIGS. 16 and 17.

In the structure shown in FIG. 19, the sensing means 1201 can be structured with only the capacitor C1. Thus, a signal proportional to the output power can be obtained. The sensing means 1201 may be a diode, a resister, or the like.

Since the stray impedance Zvdd1 203 and the stray impedance Zgnd 1204 vary depending on the mounting method of the PA-IC chip, the proportional coefficient depends on the mounting method thereof. Thus, the value of the power detected from the power detector DET may vary depending on the mounting method of the PA-IC chip. The level of the signal detected from the terminal VDD1 is around −50 dB of the output power of the RF signal. Thus, since the signal level is relatively low, the power controlling circuit (CONT) 171 cannot receive a low frequency detection signal from the power detector DET.

Figure 20:
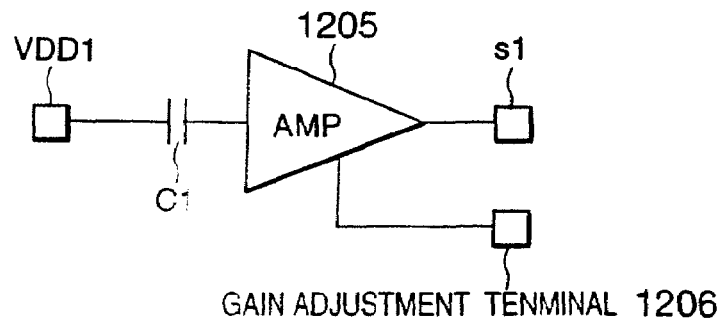
FIG. 20 is a schematic diagram showing another example of the sensing means.

To solve this problem, as shown in FIG. 20, a sensing means 1201 may be structured with a variable gain radio frequency amplifier (AMP) 1205 that is tandem-connected to the capacitor C1 and then connected to a terminal s1.

To match the output signal of the power detecting circuit DET with the dynamic range of the power controlling circuit (CONT) 171, the variable gain radio frequency amplifier (AMP) 1265 is connected to the next stage of the capacitor C1. The variable gain radio frequency amplifier (AMP) 1205 has a gain adjustment terminal 1206. When a control signal is sent from the power controlling circuit (CONT) 171 to the gain adjustment terminal 1206, an output signal corresponding to the control signal can be obtained. Thus, when the IC chip is mounted, the amplitude of the power detection signal can be suppressed from fluctuating. Consequently, a power detection signal whose signal level is high and stable is sent to the power controlling circuit (CONT) 171. Thus, the power controlling circuit (CONT) 171 sufficiently detects the power detection signal.

In the circuit structure shown in FIG. 20, since the variable gain radio frequency amplifier (AMP) 1205 is tandem-connected to the capacitor C1, the power controlling circuit (CONT) 171 can sufficiently detect the power detection signal. Thus, the circuit can be practically structured as an IC chip.

Although the variable gain radio frequency amplifier (AMP) 1205 formed as an IC chip also consumes a power, it is sufficiently smaller than the power consumption of the power amplifier (PA) 151. Thus, the power consumption of the variable gain radio frequency amplifier (AMP) 1205 can be omitted in the transmitting portion.

Next, with reference to FIG. 21, the real structure of the variable gain radio frequency amplifier (AMP) 1205 will be described.

Figure 21:
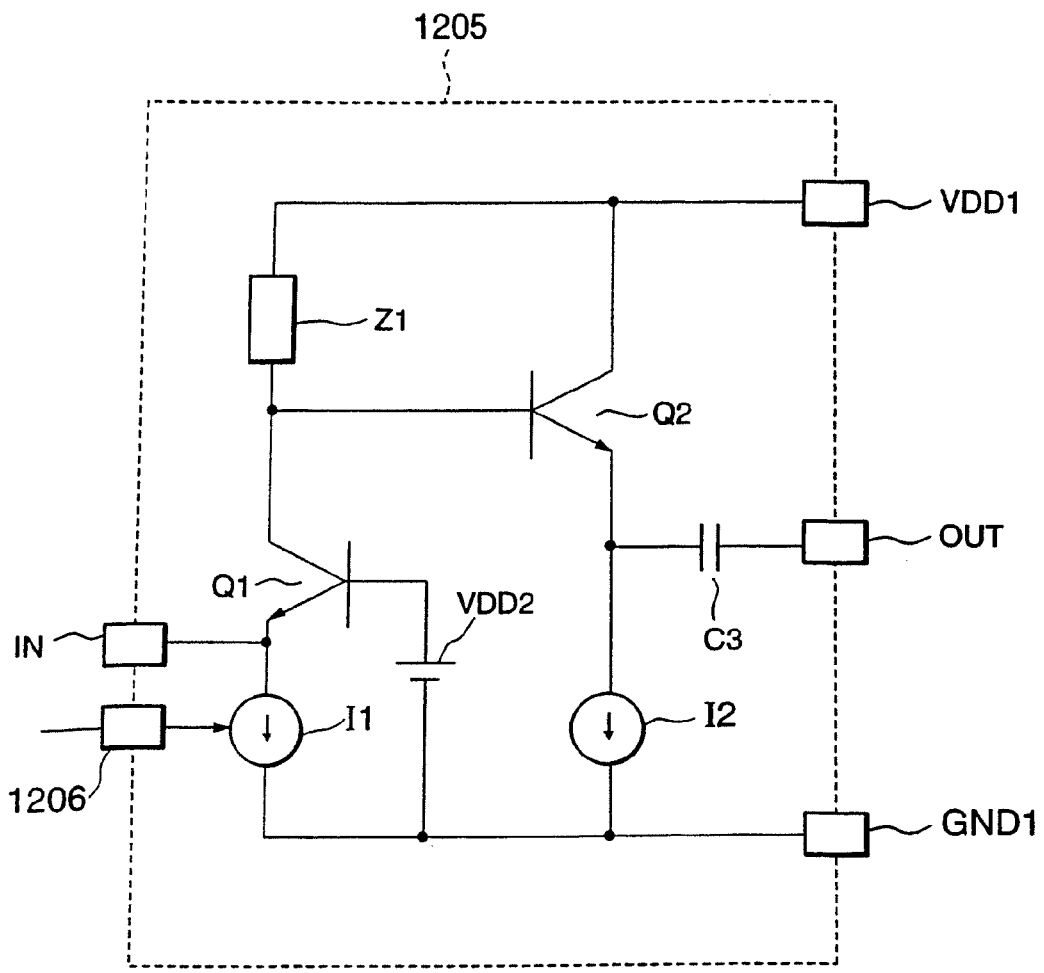
FIG. 21 is a schematic diagram showing a real example of a variable gain controlling circuit shown in FIG. 20.

Referring to FIG. 21, VDD2 is a voltage source. A positive electrode of a voltage source VDD2 is connected to a base terminal of a transistor Q1. A negative electrode of the voltage source VDD2 is connected to a ground terminal GND of the IC chip. An emitter terminal of the transistor Q1 is connected to an input terminal in. In addition, the emitter terminal of the transistor Q1 is connected to a ground terminal GND1 through a variable current source I1. A gain control signal is sent from the gain adjustment terminal 1206 to the variable current source I1. A collector terminal of the transistor Q1 is connected to a power supply terminal VDD1 of the IC chip through a load impedance Z1. In addition, the collector terminal of the transistor Q1 is connected to a base terminal of a transistor Q2 as a buffer. A collector terminal of the transistor Q2 is connected to the power supply terminal VDD1. An emitter terminal of the transistor Q2 is connected to the ground terminal GND1 through a constant current source I2. In addition, the emitter terminal of the transistor Q2 is connected to an output terminal an output terminal out through a capacitor C3 of the DC block. In this circuit structure, the gain G can be approximately obtained by the following expression.

$$G = gm(Q1) \times Z1 = i1,dc \times Z1/Vt \quad (1)$$

where i1,dc represents a current that flows in the variable current source I1; and Vt represents a thermal voltage.

Thus, when the current i1,dc of the variable current source I1 is varied corresponding to a gain control signal received from the gain adjustment terminal 1206, the gain of the signal received from the variable gain radio frequency amplifier (AMP) 1205 can be adjusted.

Next, based on the basic concept shown in FIG. 16, several examples of which the T/R switch and the sensing means are structured as an IC chip will be described.

Figure 22:
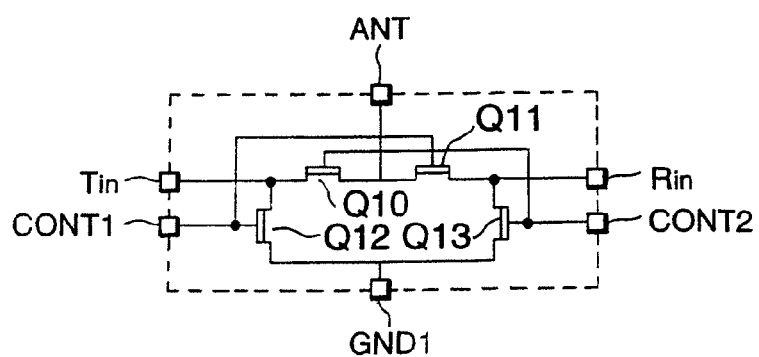
FIG. 22 is a schematic diagram showing the basic structure of an SPDT switch.

As one of the most common circuits of which the T/R switch is structured as an IC chip, a single-pole-dual-throw (SPDT) switch is known. FIG. 22 shows a basic circuit of the SPDT switch IC chip.

As shown in FIG. 22, the SPDT switch IC includes a plurality of switch devices Q10 to Q13. The switch devices Q10 to Q13 are connected to various connection terminals disposed on an outer surface of the IC chip. The various connection terminals are for example a transmitting portion input terminal Tin, a receiving portion output terminal Rin, an antenna terminal ANT, a ground terminal GND1, an input terminal cont1, and an input terminal cont2. The antenna terminal ANT functions as an output terminal of the transmitting portion and an input terminal of the receiving portion. The antenna terminal ANT is connected to the antenna 101. The ground terminal GND1 is a ground terminal of the IC chip. Control signals that have a complementary relation are input to the input terminals cont1 and cont2. The control signals cause the receiving mode and the transmitting mode to be switched. When the signal level at the input terminal cont1 is high "H" and the signal level at the input terminal cont2 is low "L", the switch devices Q11 and Q12 are connected and the switch devices Q10 and Q11 are disconnected. A signal received from the antenna terminal ANT is sent to the output terminal Rin of the receiving portion.

On the other hand, when the signal level at the input terminal cont1 is low "L" and the signal level at the input terminal cont2 is high "H", the switch devices Q11 and Q12 are disconnected and the switch devices Q10 and Q13 are connected, a signal received from the inputting terminal Tin of the transmitting portion is sent to the antenna terminal ANT.

Figure 23:
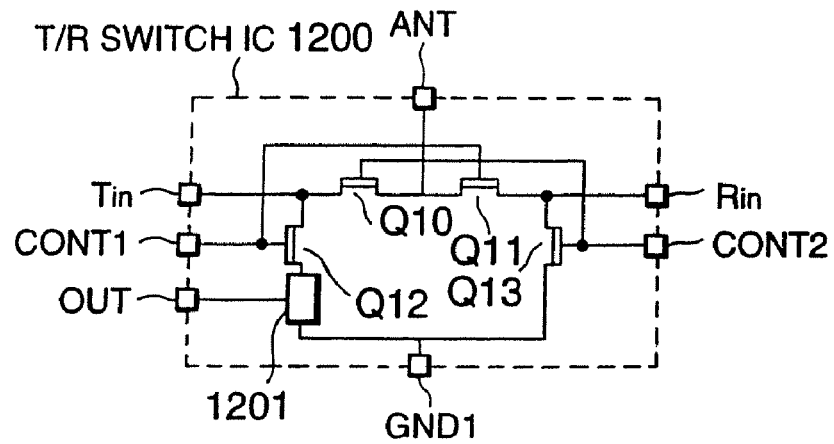
FIG. 23 is a schematic diagram showing the structure of a T/R switch IC chip according to an embodiment of the present invention.

FIG. 23 shows a T/R switch IC chip of which a sensing circuit as a sensing means for sensing a signal proportional to the power of a transmission signal is disposed in the SPDT switch IC chip.

Referring to FIG. 23, in the T/R switch IC chip 1200, a sensing means 1201 is connected between a source terminal of a switch device Q12 and a ground terminal GND1. The T/R switch IC device 1200 has a terminal out for outputting a detected result of the sensing means 1201.

Figure 24:
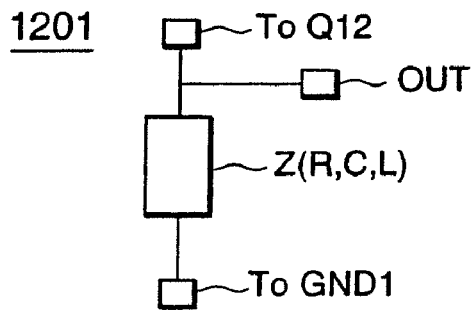
FIG. 24 is a schematic diagram showing an example of the sensing means.
Figure 25:
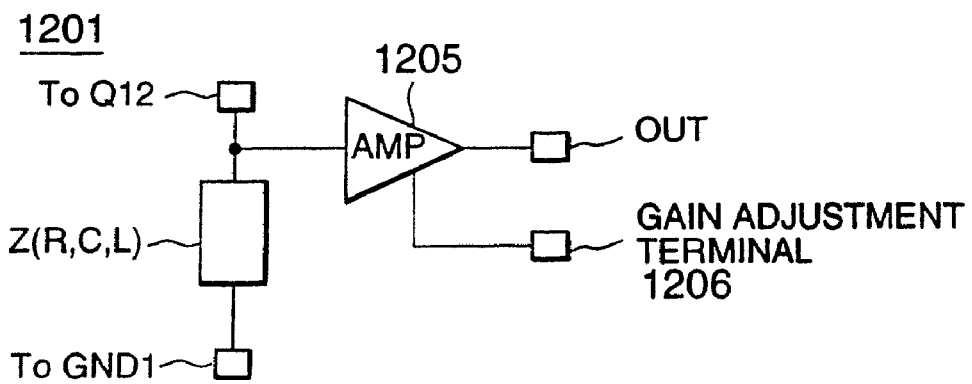
FIG. 25 is a schematic diagram showing another example of the sensing means.

FIGS. 24 and 25 show real structures of the sensing means 1201.

Referring to FIG. 24, as an example of the sensing means 1201, an impedance circuit Z is disposed between a source terminal of a switch device Q12 and a ground terminal GND1. The impedance circuit Z is composed of a resister, a capacitor, and/or an inductance that are connected in series or in parallel. In this example, a terminal out is connected between the impedance circuit Z and a source terminal of the switch device Q12.

Next, the operation of the IC chip 1200 will be described.

When a signal is transmitted, the signal level at the input terminal cont1 is low "L" and the signal level at the input terminal cont2 is high "H", the switch device Q12 is disconnected. However, since an RF signal is input to the input terminal Tin of the transmitting portion, the capacitor between the source terminal and the drain terminal of the switch device Q12 or the capacitor between the source terminal and the gate terminal and the capacitor between the gate terminal and the drain terminal are connected in series, the RF signal leaks out from the terminal out. Since the leakage current flows in the impedance Z, a voltage proportional to the leakage current takes place. Since the leakage current is proportional to the power of the RF signal, a signal proportional to the power of the RF signal can be obtained from the terminal out.

FIG. 25 shows another example of the sensing means 1201. Referring to FIG. 25, a variable gain radio frequency amplifier (AMP) is connected between an impedance circuit Z and an output terminal out. The variable gain radio frequency amplifier (AMP) 1205 amplifiers a signal generated by the impedance circuit Z. The gain is adjusted with a gain control signal (for example, an applied voltage) received from a gain adjustment terminal 1206.

Figure 26:
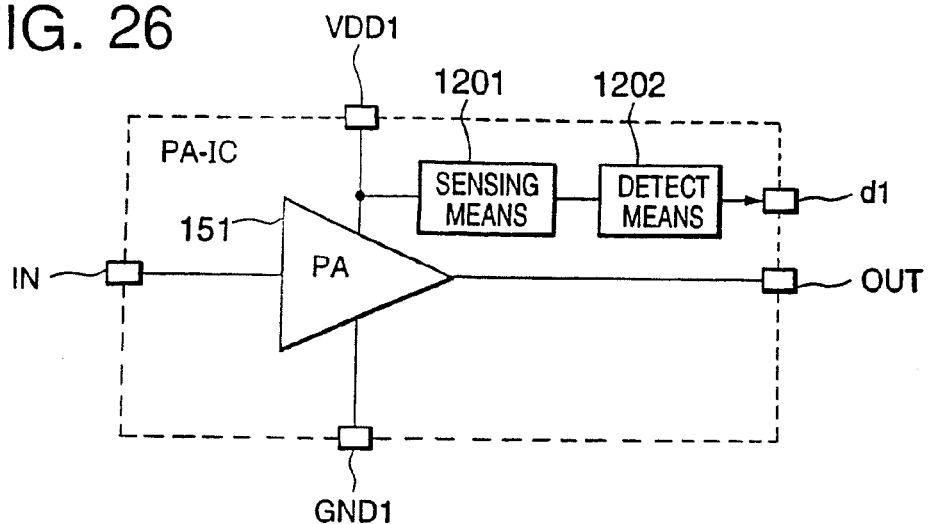
FIG. 26 is a schematic diagram showing the structure of the PA-IC chip according to an embodiment of the present invention.

Next, with reference to FIG. 26, a PA-IC chip of which a power amplifier (PA) 151 is structured as an IC chip will be described. Referring to FIG. 26, a power amplifier (PA) 151, a sensing means 1201, and an output power detecting means 1202 shown in FIG. 17 are structured as the PA-IC chip.

In the PA-IC chip 1200, a signal proportional to a power to be detected is obtained from a terminal d1. The signal is sent to a power controlling circuit (CONT) 171 shown in FIG. 11.

With the PA-IC chip 1200 having the sensing means 1201 and the output power detecting means 1202, a power can be sensed and detected. Thus, the size of the transmitting portion can be decreased.

Figure 27:
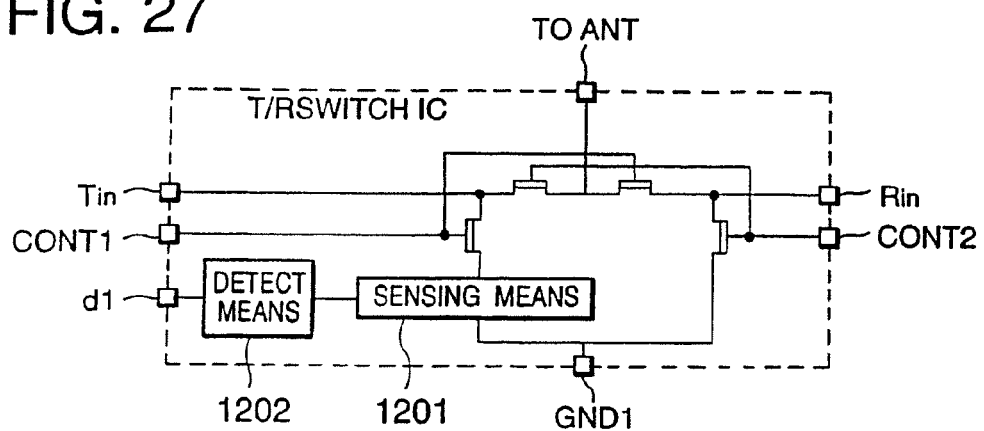
FIG. 27 is a schematic diagram showing the structure of a T/R switch IC chip according to an embodiment of the present invention.

Next, with reference to FIG. 27, a T/R switch IC chip of which a T/R switch is structured as an IC chip will be described. Referring to FIG. 27, a T/R switch circuit, a sensing means 1201, and an output power detecting means 1202 are structured as the T/R switch IC chip.

In this case, a signal proportional to an output power is obtained from a terminal d1 as with the above-described example. The structure of the sensing means 1201 is the same as the structure of the sensing means shown in FIG. 19, 20, 21, 24, and 25. In this example, at least one of the power amplifier PA and the T/R switch is structured as an IC chip.

With the T/R switch IC chip having the sensing means 1201 and the output power detecting means 1202, a power can be sensed and detected. Thus, the size of the transmitting portion can be decreased.

Since the sensing means and the detecting means shown in FIGS. 18, 23, 26, and 27 can detect a power that leaks out to the power supply or ground without need to connect them to an RF signal line, the power loss of the directional coupler and so forth can be suppressed. Thus, the power consumption of the transmitting portion can be decreased.

Figure 28:
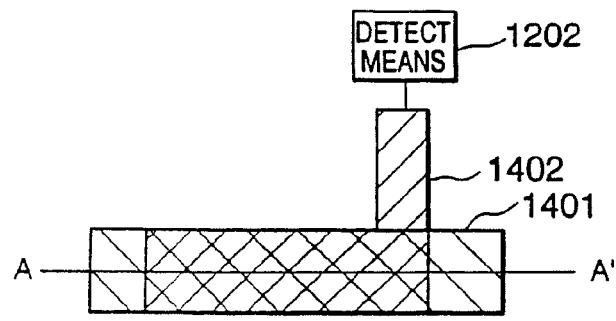
FIG. 28 is a plan view showing the structure of an IC chip that has the power sensing device and the power detecting device shown in FIGS. 19 and 20 according to an embodiment of the present invention.
Figure 29:
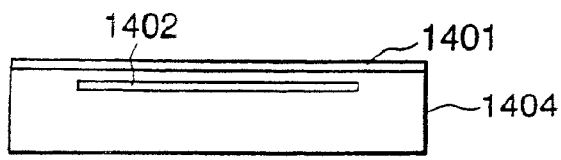
FIG. 29 is a sectional view taken along line A-A' shown in FIG. 28.

FIG. 28 is a plan view showing an IC chip having a power sensing device and a power detector shown in FIGS. 19 and 20. FIG. 29 is a sectional view taken along line A-A of FIG. 28.

As shown in FIGS. 28 and 29, in the IC chip, a metal wire pattern 1402 as a first metal layer (inner layer) is formed in an insulation layer 1404. In addition, a metal wire pattern 1401 as a second metal layer (surface layer) is formed on the front surface of the insulation layer 1404. The metal wire pattern 1401 is a power wire pattern for supplying a power to a power amplifier (PA) 151. The metal wire pattern 1402 is bent in an L letter shape. The bent edge of the metal wire pattern 1402 is connected to an output power detecting means 1202.

In this case, since the metal wire pattern 1401 is disposed on the power wire pattern 1402 through the insulation layer 1404, a capacitance component is formed. An output power detecting means 1202 connected to the metal wire pattern 1402 detects the amount of variation of the capacitance as the amount of variation of the power.

When a power sensing means or a power detecting means is disposed as an IC chip, for suppressing the loss, a metal layer is sometimes formed on the power wire pattern 1401 through an insulation layer so as to form a capacitance component and thereby capacitance-couple the power wire pattern 1401 and the metal layer.

However, in this embodiment, the metal wire pattern 1402 formed in the insulation layer 1404 below the power wire pattern 1401 is varied so as to capacitance-couple the power wire pattern 1401 and the metal wire pattern 1402.

Figure 30:
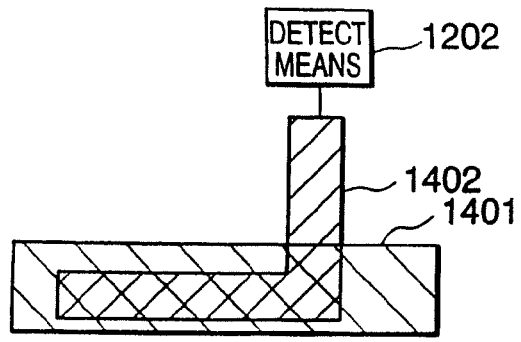
FIG. 30 is a schematic diagram showing the structure of which a line width of a metal layer is narrower than a power line so as to adjust a coupling capacitance.
Figure 31:
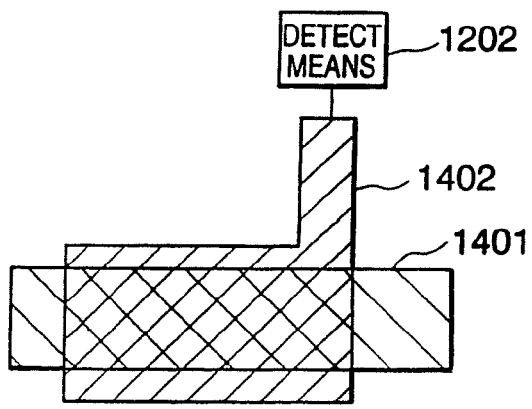
FIG. 31 is a schematic diagram showing the structure of which a line width of a metal layer is wider than a power line so as to adjust a coupling capacitance.
Figure 32:
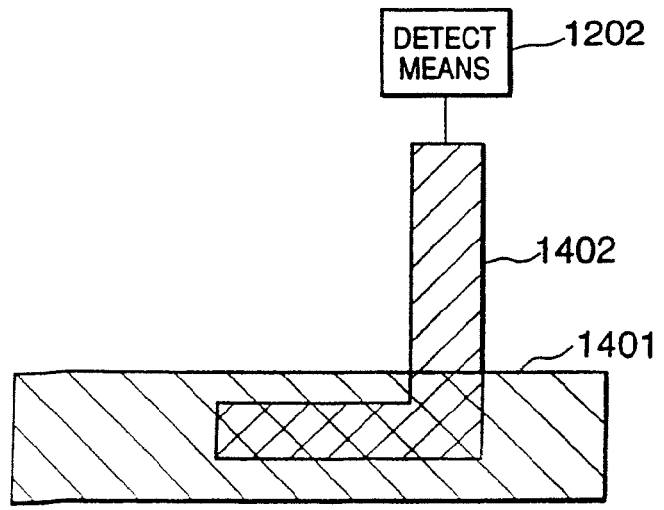
FIG. 32 is a schematic diagram showing the structure of which a line length of a metal layer is varied so as to adjust a coupling capacitance.
Figure 33:
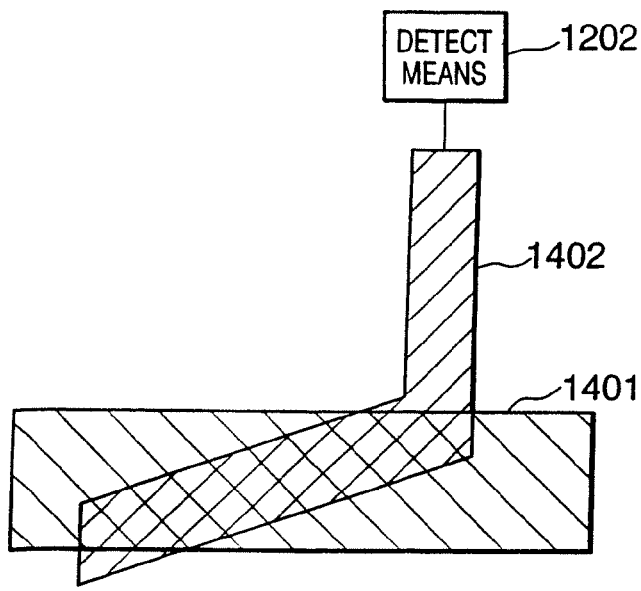
FIG. 33 is a schematic diagram showing the structure of which a forming direction of a metal layer is varied so as to adjust a coupling capacitance.

Generally, a wire for supplying a power (namely, the power wire pattern 1401) is formed in the IC chip with as large area as possible. In addition, the area of the metal wire pattern 1402 formed in the insulation layer 1404 is less restricted. Thus, since the area of the capacitor composed of the first and second layers can be increased, a power leakage can be easily detected. This condition is convenient for detecting the power. It should be noted that even if the first layer and the second layer are reversely formed, the same effect can be obtained. As shown in FIG. 30, the coupling capacitance is varied by adjusting the wire pattern widths of the metal wire patterns 1402 and 1401 so that the wire pattern width of the metal wire pattern 1402 is narrower than the wire pattern width of the power wire pattern 1401. Alternatively, as shown in FIG. 31, the coupling capacitance is varied by adjusting the wire pattern widths of the metal wire patterns 1402 and 1401 so that the wire pattern width of the metal wire pattern 1402 is wider than the wire pattern width of the power wire pattern 1401. In addition, as shown in FIG. 33, the coupling capacitance is varied by changing the forming direction of the metal wire pattern 1402 and thereby varying the overlap area between the metal wire patterns 1402 and 1401.

Figure 34:
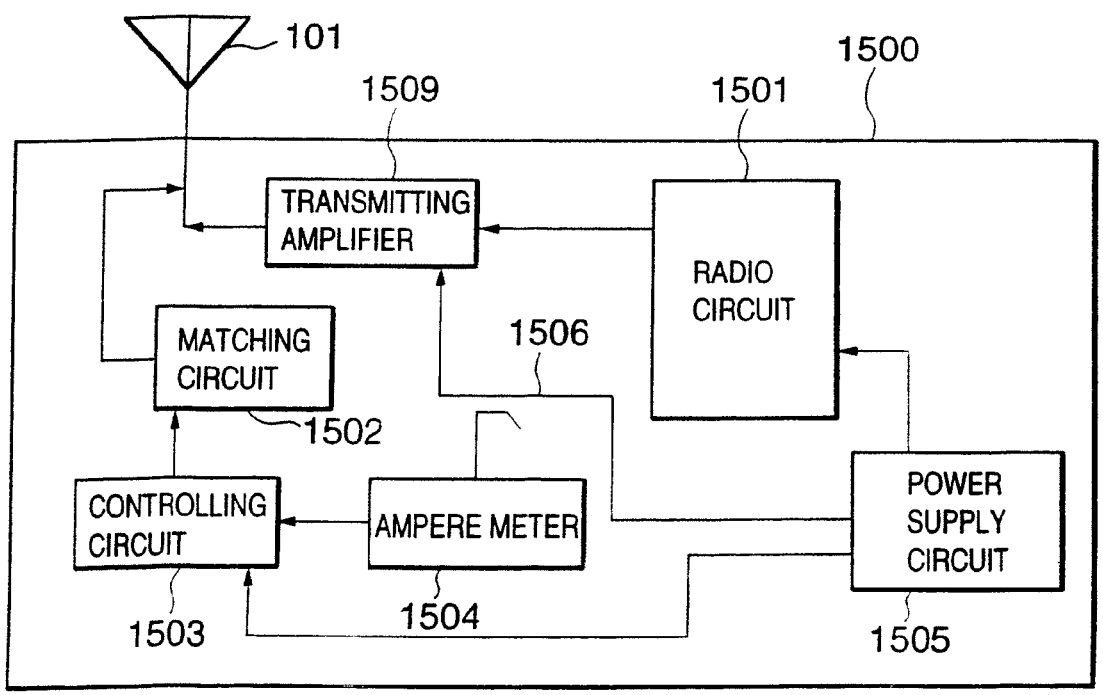
FIG. 34 is a block diagram showing the structure of a portable radio apparatus according to another embodiment of the present invention.

Last, with reference to FIG. 34, an antenna of the portable radiotelephone apparatus (hereinafter referred to as portable radio apparatus) according to another embodiment of the present invention will be described. FIG. 34 is a block diagram showing the structure of the portable radio apparatus according to the embodiment of the present invention.

Referring to FIG. 34, the portable radio apparatus comprises a casing 1500, a radio circuit 1501, a matching circuit 1502, a controlling circuit 1503, an ampere meter 1504, a power supply circuit 1505, a current measuring probe 1506, and a transmitting amplifier 1509. The radio circuit 1501 comprises frequency converters 157 and 158 and a variable attenuator 152 shown in FIG. 11. An antenna 101 extrudes from the casing 1500.

The power supply circuit 1505 supplies a power to the radio circuit 1501, the transmitting amplifier 1509, and the controlling circuit 1503. The radio circuit 1501 modulates a supplied power and generates information signal at a transmission frequency. The information signal is sent to the transmitting amplifier 1509. The transmitting amplifier 1509 amplifies the received signal and sends the amplified signal to the antenna 101. The amplified signal is transmitted from the antenna 101. However, part of the transmitted signal is sent back to the transmitting amplifier 1509 as a reflected wave. Thus, the gain and efficiency of the transmitting amplifier 1509 fluctuate, thereby causing the current consumption to fluctuate. The fluctuation of the current consumption is measured by the ampere meter 1504. The measured current level is sent to the controlling circuit 1503.

As fluctuation situations of the transmitting amplifier 1509, the amount of current that flow in the transmitting amplifier 1509 increases or decreases. For simplicity, in the following description, it is supposed that the amount of current simply fluctuates. The controlling circuit 1503 receives a signal from the ampere meter 1504 and electrically adjusts a variable portion of the matching circuit 1502 corresponding to the signal. An example of the variable portion is a variable capacitance of such as a semiconductor switch or a semiconductor.

Next, experimental results of the characteristic of the antenna 101 in the operation state of the portable radio apparatus will be described.

Figure 35:
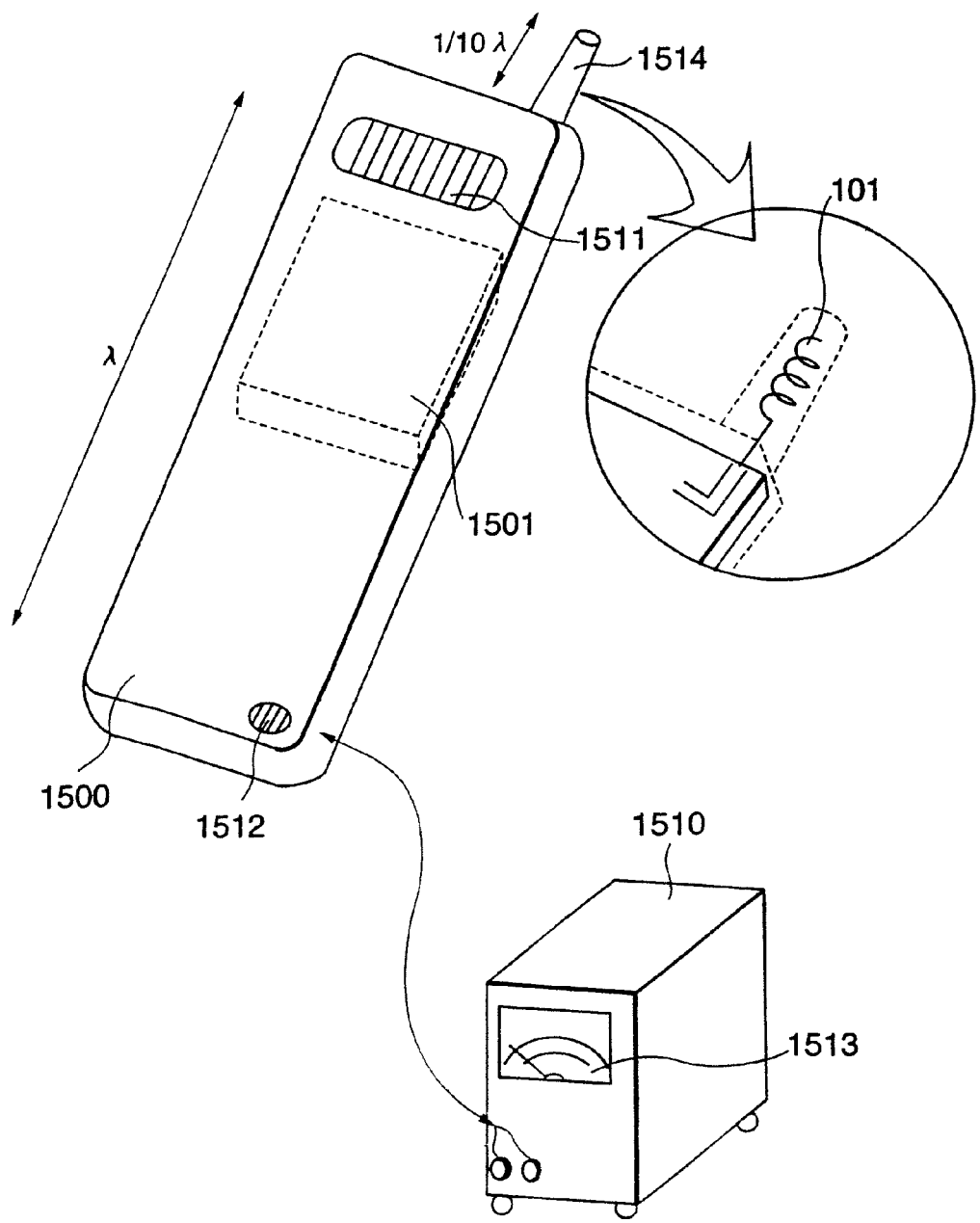
FIG. 35 is an external view showing a radio apparatus model used in an experiment.
Figure 36:
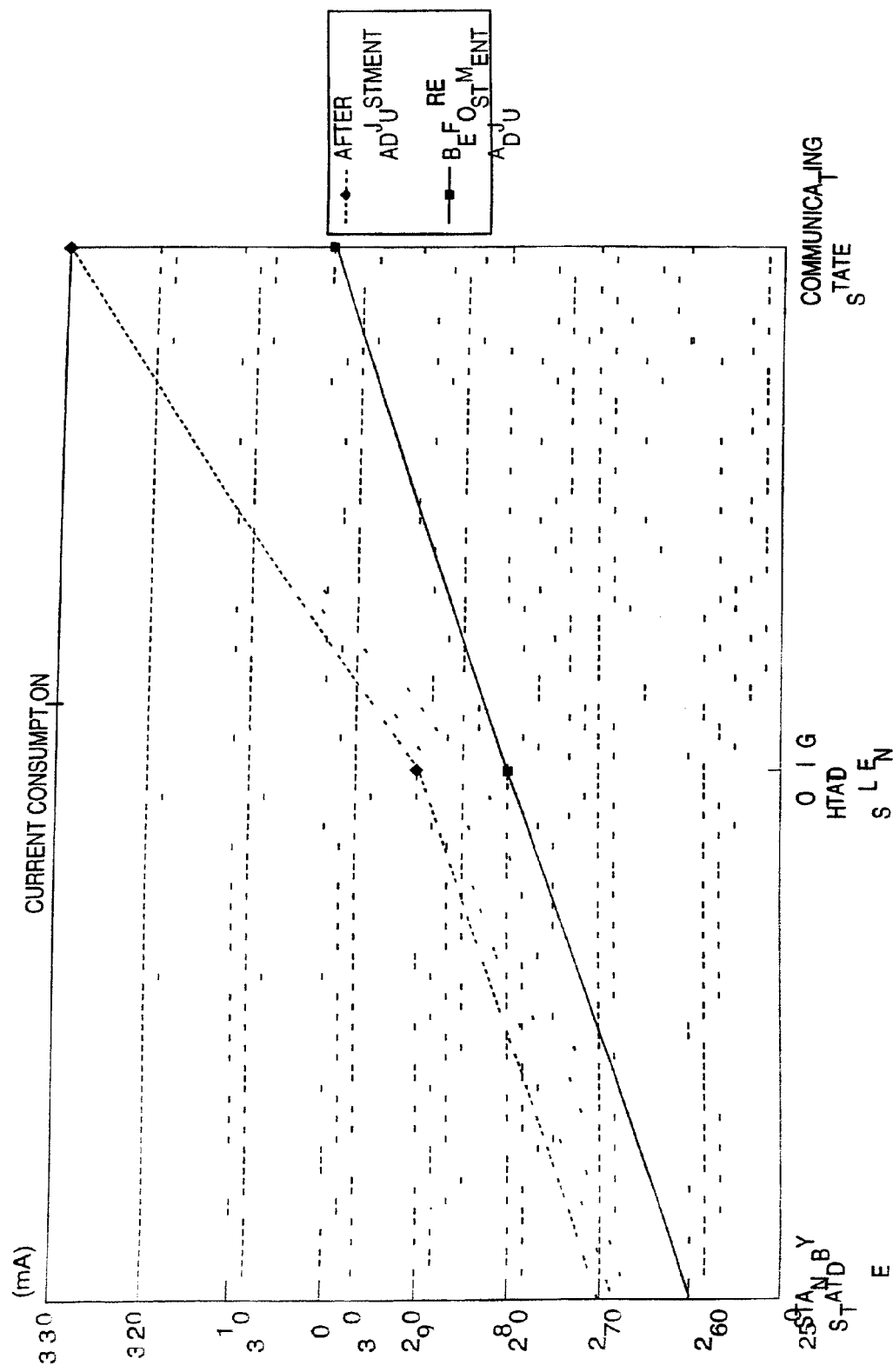
FIG. 36 is a graph showing the relation between a current consumption and operation states of the portable radio apparatus shown in FIG. 35.
Figure 37:
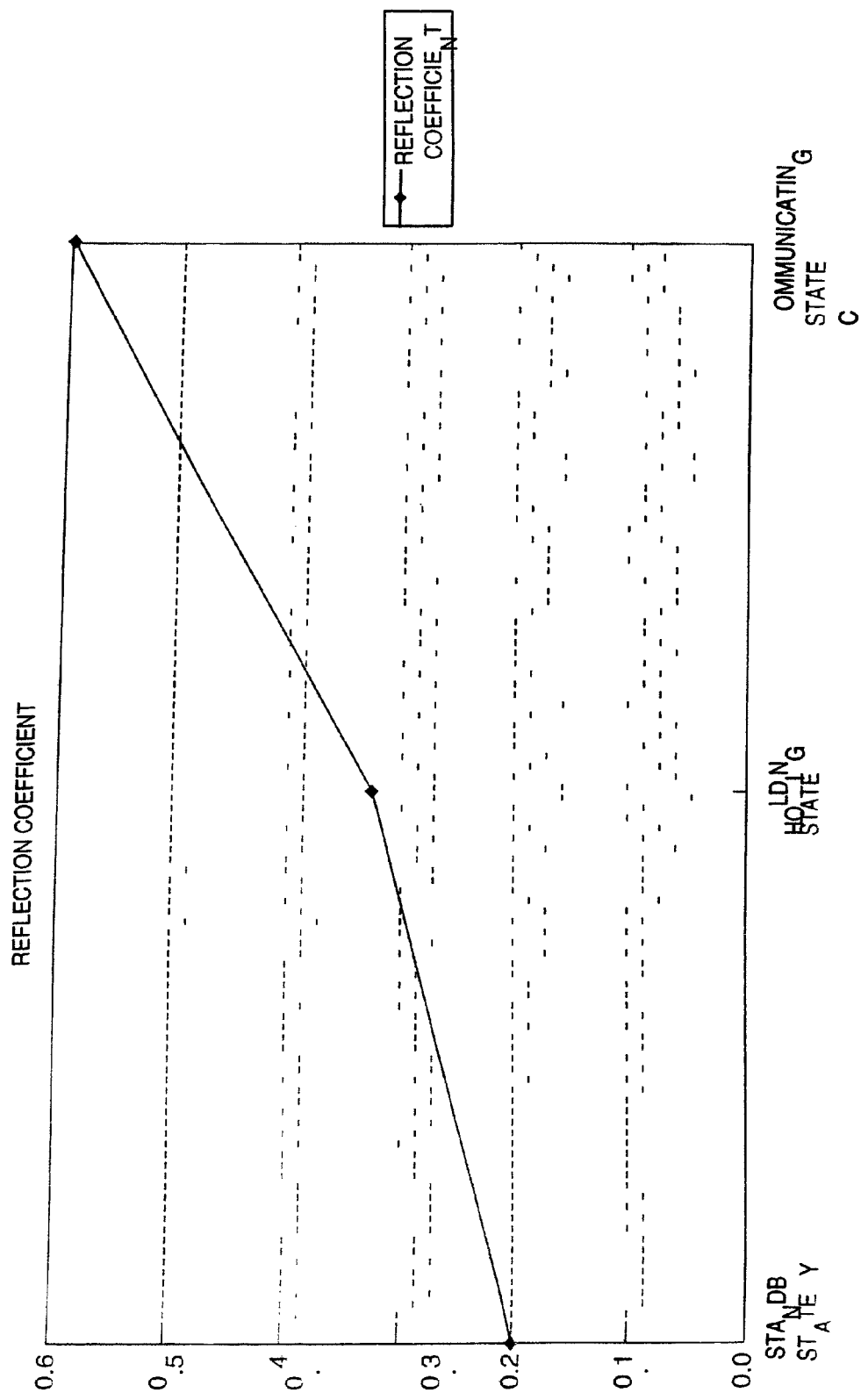
FIG. 37 is a graph showing the relation between a reflection coefficient at an input edge of the antenna viewed from the feeder line side and operation states of the portable radio apparatus.
Figure 38:
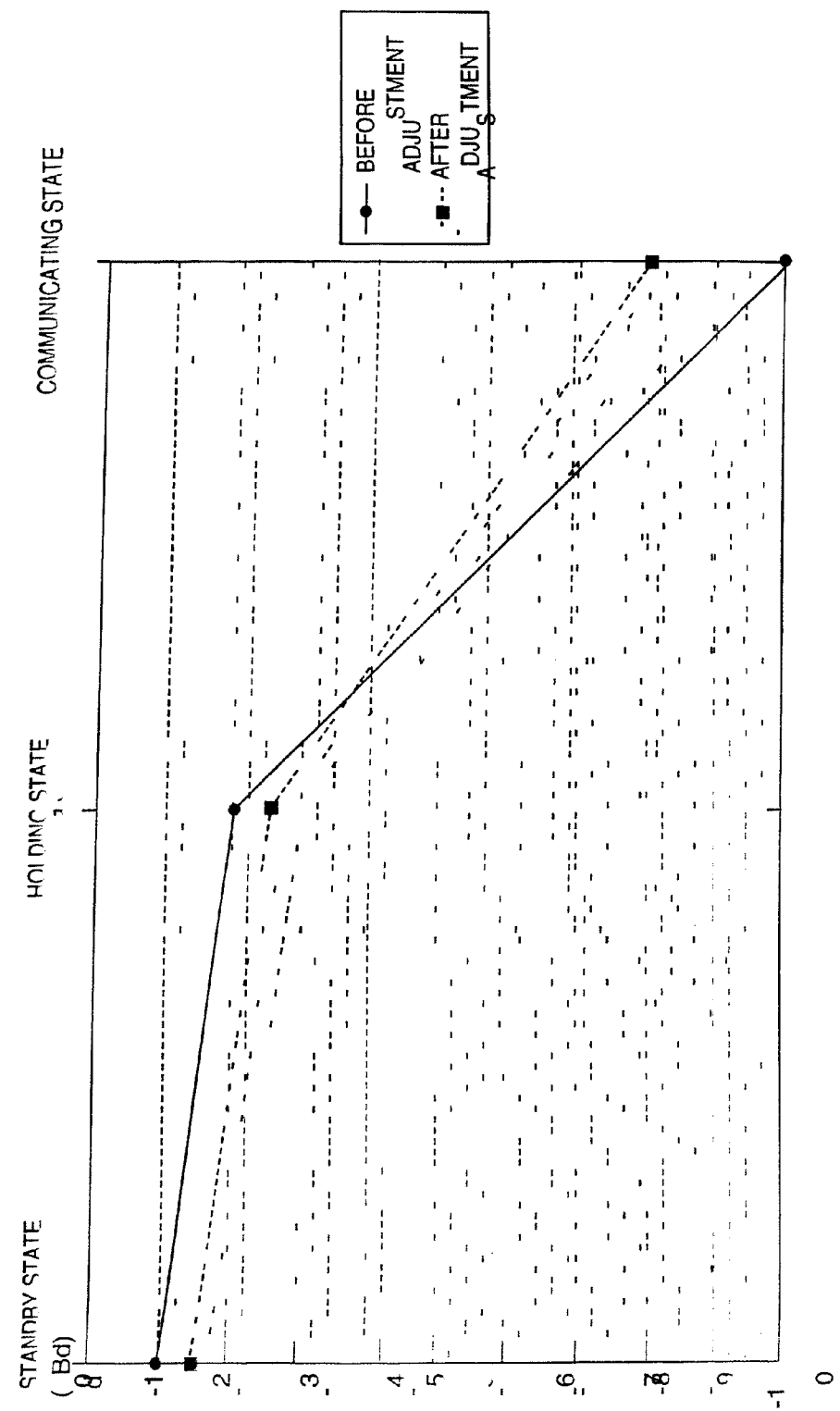
FIG. 38 is a graph showing the relation between an average radiation gain on a horizontal plane of the portable radio apparatus and operation states thereof.

FIG. 35 is a perspective view showing a radio apparatus model corresponding to the portable radio apparatus shown in FIG. 34. FIGS. 36 to 38 are graphs showing measured results of the radio apparatus model shown in FIG. 35.

Referring to FIG. 35, the radio apparatus model comprises a casing 1500, a speaker 1511, a microphone 1512, an antenna cover 1514, and a radio circuit 501. The speaker 1511, the microphone 1512, and the antenna cover 1514 are disposed on the casing 150. The radio circuit 1501 has a transmitting amplifier 1509. P coil-shaped antenna (helical antenna) 101 is disposed in the antenna cover 1514.

A power feeder is connected from an external constant voltage source 1510 to the casing 1500 so as to supply a power to the radio circuit 1501. A current consumed in the radio apparatus model was measured with an ampere meter 1513 of the constant voltage source 1510. A matching circuit 1502 is simulated by directly varying parameters of the antenna 101. The operation frequency of the radio apparatus model is around 2 GHz. The length of the casing 1500 is equal to one wave length(.lambda.). The width of the casing 1500 is around ¼ of one wave length. The thickness of the casing 1500 is around {fraction (1/20)} of one wave length. The length of the antenna 101 is around {fraction (1/10)} of one wave length.

FIG. 36 is a graph showing the relation between the operation states and the current consumption of the radio apparatus model. FIG. 37 is a graph showing a reflection coefficient at an input edge of the antenna 101 in individual operation states. FIG. 38 is a graph showing the relation between individual operation states and average power on horizontal plane radiated from the radio apparatus model.

FIGS. 36 and 37 show that the reflection coefficient of the antenna 101 varies corresponding to the individual operation states of the radio apparatus model and that the current consumption of the transmitting amplifier 1509 varies corresponding to the individual operation states. FIG. 38 shows that the radiation power of the antenna 101 decreases in the order of the standby state, the holding state, and the communicating state. These phenomena represent that the antenna 101 is a load of the transmitting amplifier 1509. In other words, when the load varies, the operation state of the power amplifier PA and so forth varies. Thus, the current consumption increases. It is clear that the fluctuation of the load is caused by the body of the user.

Thereafter, the antenna parameters are optimized corresponding to the current value. The current consumption increases in the order of the standby state, the holding state, and the communicating state. Thus, to decrease the current consumption as in the standby state, antenna parameters should be properly changed. In this experiment, as an antenna parameter, the antenna length was varied. This is because when the antenna length is varied, the response frequency of the antenna 10 can be varied. Experimental results show that when the antenna length decreases, the current consumption decreases. In the state that the antenna shrinks, the radiation power increases by around 2 dB in comparison with the state that the antenna does not shrink. Thus, experimental results show that the deterioration of the characteristics of the antenna 101 becomes small in the method according to the present invention.

Figure 39:
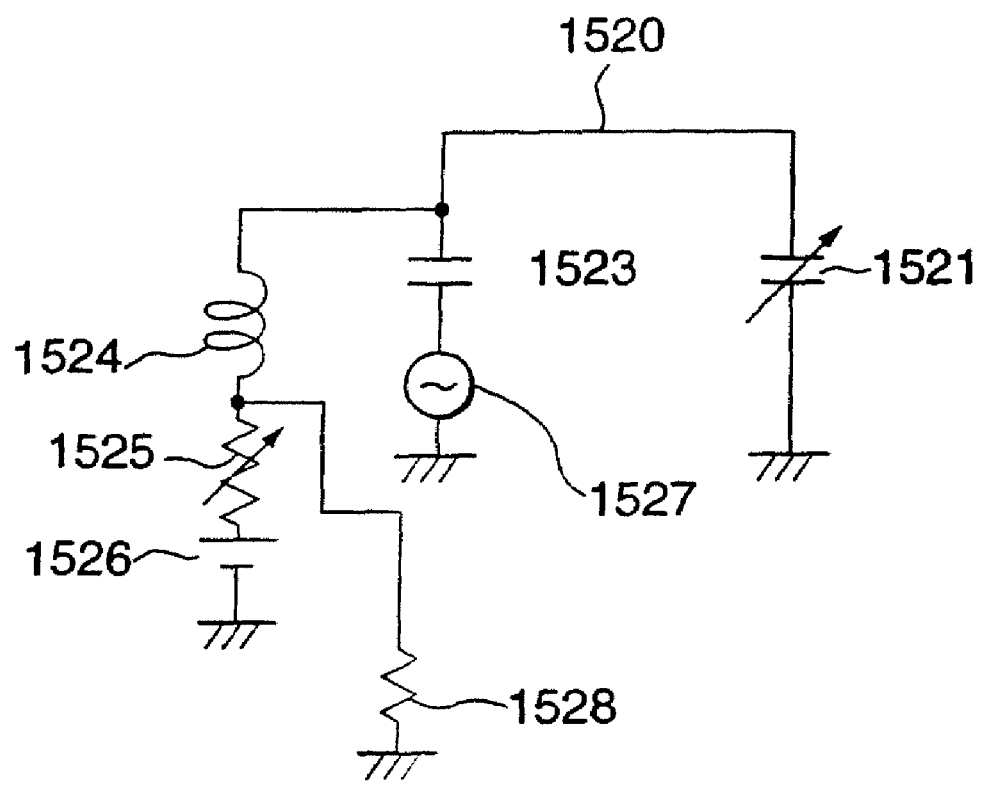
FIG. 39 is a schematic diagram showing the structure of an antenna matching circuit.

In the experiment, the antenna length was adjusted. Alternatively, the characteristics of the matching circuit 1502 can be varied. FIG. 39 shows a real structure of which the characteristics of the matching circuit 1502 are varied.

Referring to FIG. 39, the matching circuit 1502 comprises an antenna device 1521, a variable capacitor 1522, a capacitor 1523, an inductor 1524, a variable resistor 1525, a controlling power supply 1526, a radio frequency source 1527, -and a resistor 1528.

The length of the antenna device 1521 is shorter than ¼ of one wave length. The capacitor 1523 is a low pass capacitor for preventing a current of the controlling power supply 1526 from flowing to the radio frequency source 1527. The inductor 1524 is a coil for preventing a radio frequency signal from flowing to the controlling circuit 1503. The variable resistor 1525 controls the voltage applied to the antenna device 1521. The variable capacitor 1522 is a capacitance that takes place in the matching circuit 1502.

In this case, when the value of the variable resistor 1525 is varied, the value of the variable capacitor 1522 is varied. The increase of the value of the variable capacitor 1522 is equivalent to the increase of the length of the antenna device 1521, thereby decreasing the resonance frequency. The decrease of the value of the variable capacitance 1522 is equivalent to the decrease of the length of the antenna device 1521, thereby increasing the resonance frequency. Thus, when the response frequency of the antenna device 1521 is varied, the matching condition can be varied.

Consequently, according to the portable radio apparatus according to the embodiment of the present invention, when the body of the user approaches the antenna, the characteristics of the antenna can be improved.

According to the above-described embodiments, the current consumption of the portable radio apparatus can be decreased. In addition, the efficiency of the portable radio apparatus can be improved. Moreover, a non-time varying DC offset and a time-varying DC offset that cause an error ratio of the receiving portion to increase can be removed. Furthermore, the size of the portable radio apparatus can be decreased. In addition, a blank channel can be searched at high speed.

As described above, according to the present invention, the receiving portion of the radio apparatus detects the power of the system band and the power of a desired wave and controls the current consumption corresponding to the detected results. Thus, the power consumption of the radio apparatus can be decreased. When the receiving portion has an AC coupling capacitor, the deterioration of the frequency characteristic is compensated with the characteristic of the capacitor. Consequently, a DC offset that deteriorates the error ratio of the received signal can be removed. In addition, since the power of a reflected wave by a reflector is detected by the directional coupler and each circuit portion that generates a DC offset is controlled corresponding to the reflected power and the transmitted power, a time-varying DC offset can be removed.

Since the synthesizer portion widens the band of a loop filter for searching a blank channel, it can search a blank channel at high speed.

When the synthesizer portion detects many blank channels, it causes the radio apparatus to operate in a low power consumption mode. Thus, the power consumption of the radio apparatus can be decreased.

With respect to the transmitting portion, since the power sensing means and the power detecting means are structured as an IC chip, the size of the transmitting portion can be decreased. In addition, a directional coupler that causes a transmission power loss can be omitted. Thus, the power consumption of the radio apparatus can be decreased. With respect to the antenna, the operating current of the power amplifier is detected. The matching circuit of the antenna is varied corresponding to the operating current. Thus, the deterioration of the characteristic of the antenna can be compensated in individual operation states of the radio apparatus. Consequently, the power consumption of the radio apparatus can be decreased. In addition, the performance of the radio apparatus can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed as new and desired to be protected by Letters Patent is:

1. A radio apparatus for repeatedly transmitting and receiving a predetermined number of slots with a plurality of radio frequency signals available in a radio system band and data communication using a blank slot, comprising:
   a phase synchronizing circuit having:
   a phase comparator for generating a voltage corresponding to the phase difference between the phase of a reference signal and the phase of a comparing frequency divided signal, and
   a voltage controlling oscillator for generating a frequency corresponding to a control voltage;
   a first loop filter for causing said phase synchronizing circuit to perform a phase synchronizing operation at a predetermined speed;
   a second loop filter for causing said phase synchronizing circuit to perform the phase synchronizing operation at a higher speed than the predetermined speed; and
   a loop filter selecting means for connecting said first loop filter to said voltage controlling oscillator in the period of one of the slots that is used for a communication and for connecting said second loop filter to said voltage controlling oscillator when the period of the slot is over.

2. The radio apparatus as set forth in claim 1,
   wherein a blank channel is searched while said loop filter selecting means is connecting said second loop filter to said voltage controlling oscillator.

\* \* \* \* \*